United States Patent
Ren et al.

(10) Patent No.: US 12,441,624 B2
(45) Date of Patent: Oct. 14, 2025

(54) N-TYPE $Mg_{3.2}Bi_2$-BASED MATERIALS FOR THERMOELECTRIC COOLING APPLICATION

(71) Applicant: University of Houston System, Houston, TX (US)

(72) Inventors: Zhifeng Ren, Pearland, TX (US); Jun Mao, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 86 days.

(21) Appl. No.: 17/616,995

(22) PCT Filed: Jul. 3, 2020

(86) PCT No.: PCT/US2020/040818
§ 371 (c)(1),
(2) Date: Dec. 6, 2021

(87) PCT Pub. No.: WO2021/007126
PCT Pub. Date: Jan. 14, 2021

(65) Prior Publication Data
US 2022/0162086 A1    May 26, 2022

Related U.S. Application Data

(60) Provisional application No. 62/870,884, filed on Jul. 5, 2019.

(51) Int. Cl.
*H10N 10/853* (2023.01)
*C01G 29/00* (2006.01)

(52) U.S. Cl.
CPC .......... *C01G 29/00* (2013.01); *H10N 10/853* (2023.02); *C01P 2006/40* (2013.01)

(58) Field of Classification Search
CPC .... C01P 2006/40; C01G 29/00; H10N 10/853
See application file for complete search history.

(56) References Cited

U.S. PATENT DOCUMENTS

| | | | |
|---|---|---|---|
| 7,465,871 B2 | 12/2008 | Chen et al. | |
| 8,293,168 B2 | 10/2012 | Chen et al. | |
| 9,011,763 B2 | 4/2015 | Chen et al. | |
| 10,121,953 B2 | 11/2018 | Tamaki et al. | |
| 2002/0024154 A1* | 2/2002 | Hara | H10N 10/855 257/712 |
| 2009/0211619 A1 | 8/2009 | Sharp et al. | |

(Continued)

FOREIGN PATENT DOCUMENTS

WO    WO-2017143213 A1 *    8/2017    ........... B22F 1/0018

OTHER PUBLICATIONS

Ponnambalam et al., On the thermoelectric properties of Zintl compounds Mg3Bi(2-x)Pnx (Pn=P and Sb).*

(Continued)

*Primary Examiner* — Uyen M Tran
(74) *Attorney, Agent, or Firm* — CONLEY ROSE, P.C.

(57) ABSTRACT

New thermoelectric materials, such as $Mg_3Bi_2$-based Zintl phase compounds are described, where the semi-metallic $Mg_{3.2}Bi_2$ show an unexpectedly large Seebeck coefficient at 350 K and enhanced thermoelectric performances.

14 Claims, 14 Drawing Sheets

(56) References Cited

U.S. PATENT DOCUMENTS

2010/0307551 A1     12/2010   Ravi et al.
2011/0139208 A1*    6/2011   Lee ..................... H10N 10/852
                                                                                                 252/67
2017/0250334 A1      8/2017   Hermes et al.

OTHER PUBLICATIONS

Significant role of Mg Stoichiometry in Designing high thermoelectric performance for Mgs(Sb, Bi)2 based n-type Zintls (Year: 2018).*
PCT/US2020/040818 International Search Report and Written Opinion dated Sep. 24, 2020 (15 p.).

* cited by examiner

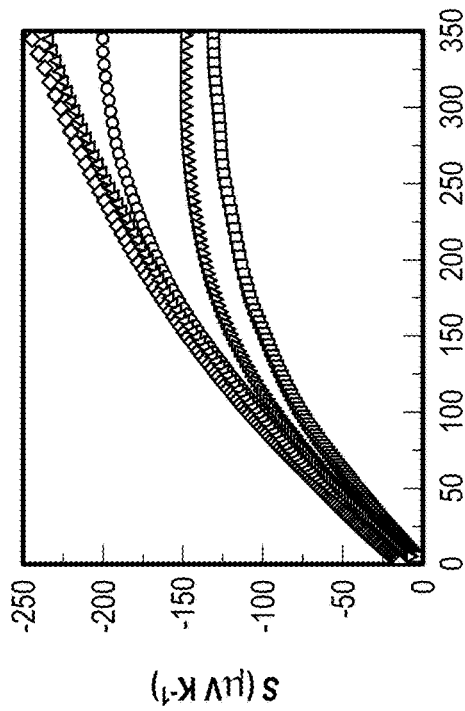
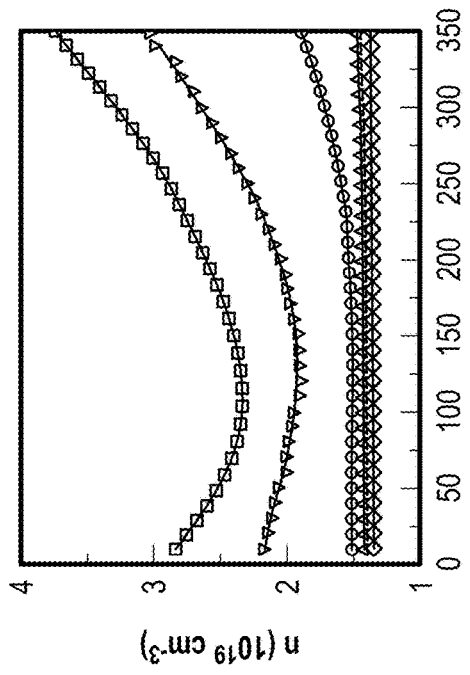
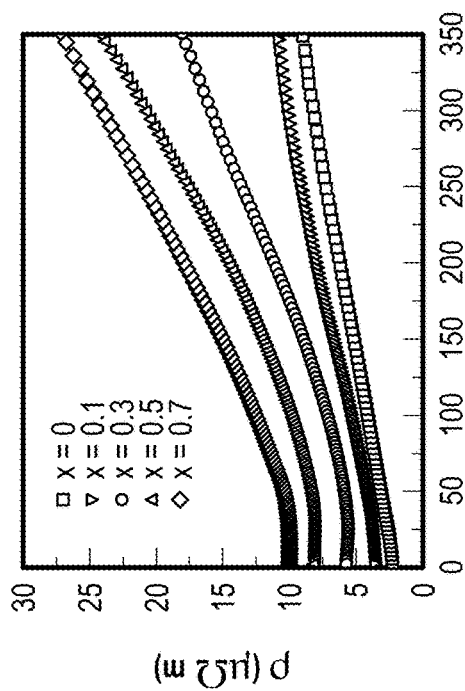
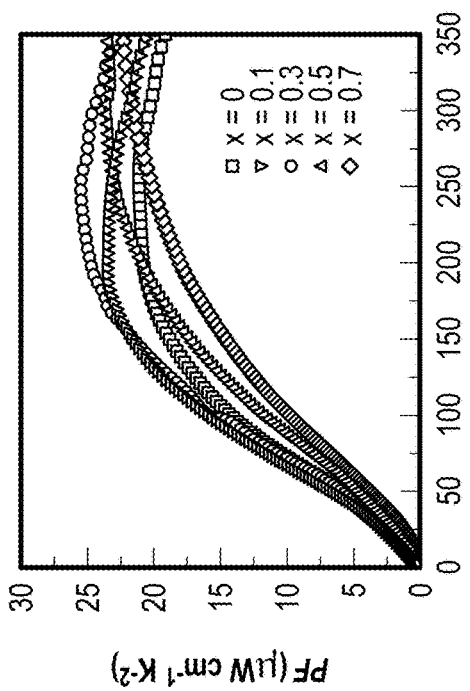
FIG. 4(a)
FIG. 4(b)
FIG. 4(c)
FIG. 4(d)

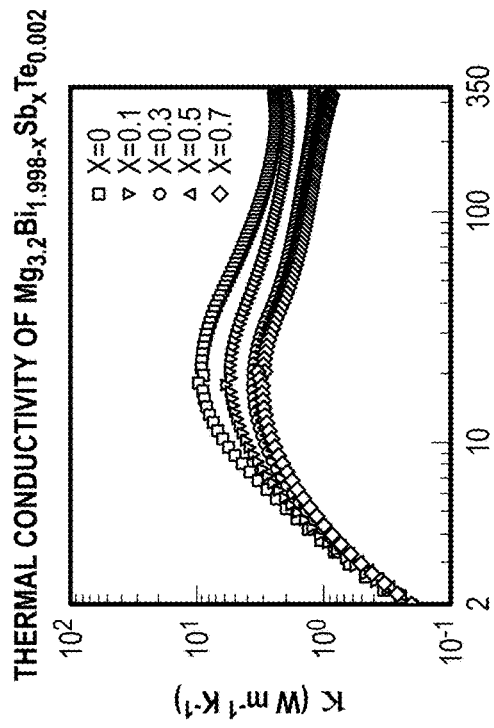
FIG. 15
FIG. 14
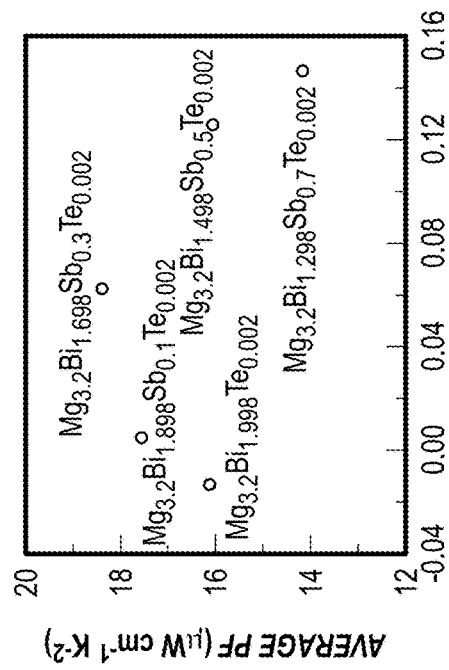
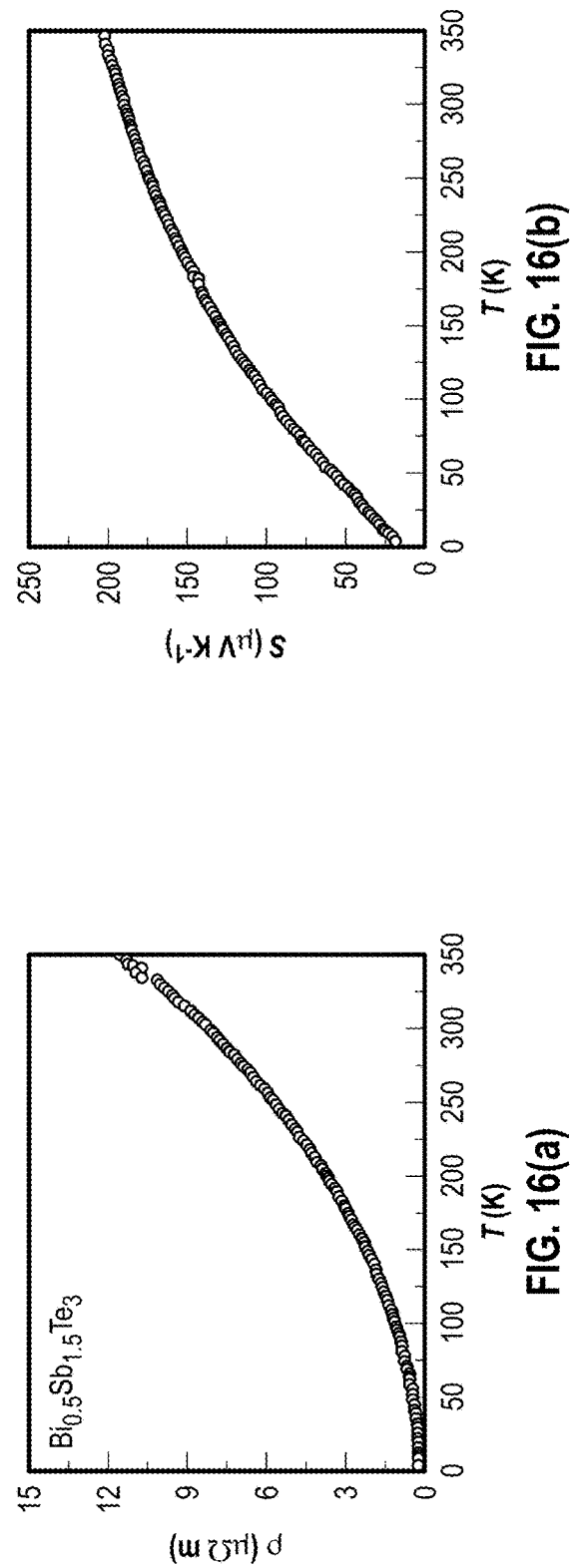
FIG. 16(a)
FIG. 16(b)

N-TYPE $Mg_{3.2}Bi_2$-BASED MATERIALS FOR THERMOELECTRIC COOLING APPLICATION

CROSS-REFERENCE TO RELATED APPLICATIONS

The present application is a 35 U.S.C. § 371 national stage application of PCT/US2020/040818 filed Jul. 3, 2020, and entitled "N-Type $MG_{3.2}Bi_2$-Based Materials for Thermoelectric Cooling Application," which claims benefit of U.S. Provisional Patent Application No. 62/870,884, filed Jul. 5, 2019, and entitled "N-Type $MG_{3.2}Bi_2$-Based Materials for Thermoelectric Cooling Application," each of which is hereby incorporated herein by reference in their entirety for all purposes.

STATEMENT REGARDING FEDERALLY SPONSORED RESEARCH OR DEVELOPMENT

N/A

FIELD OF THE INVENTION

The disclosure herein is related to the field of n-type $Mg_{3.2}Bi_2$-based compounds with improved thermoelectric performance, wherein n-type $Mg_{3.2}Bi_2$-based materials provide an improved thermoelectric cooling.

BACKGROUND

The goal of utilizing waste heat for electricity via the Seebeck effect and cooling via the Peltier effect have motivated research on thermoelectrics for decades. When applying a thermoelectric material at a certain temperature, the electron-hole pairs could be thermally activated (i.e., bipolar conduction), greatly deteriorating the thermoelectric performance. Hence, embodiments herein address such needs and demonstrate that the electron-to-hole weighted mobility ratio (A), which can be used to quantify the asymmetry of transport properties between the conduction and valence bands, plays a pivotal role in bipolar conduction. When A has an extreme value, either A>>1 or A<<1, the effect of bipolar conduction can be substantially suppressed. The disclosure herein addresses such needs, and discloses that it has been found that the n-type semi-metallic $Mg_{3.2}Bi_2$ (nominal composition) with a large A above eight exhibits an unexpectedly large Seebeck coefficient above $-100\ \mu V\ K^{-1}$ at 300 K and very promising thermoelectric performance. The optimized $Mg_{3.2}Bi_{1.298}Sb_{0.7}Te_{0.002}$ (nominal composition) can achieve a peak ZT above 0.9 at 350 K. The n-type $Mg_{3.2}Bi_2$-based materials show great applicability for thermoelectric cooling. When paired with p-type $Bi_{0.5}Sb_{1.5}Te_3$, a large temperature difference of ~91 K can be realized at the hot-side temperature of ~350 K, which outperforms the commercial thermoelectric legs consisting of p-type $Bi_{0.5}Sb_{1.5}Te_3$ and n-type $Bi_2Te_{2.7}Se_{0.3}$.

BRIEF SUMMARY

The disclosure herein relates in some embodiments to a thermoelectric material, comprising a $Mg_3Bi_2$-based Zintl phase compound, wherein the $Mg_{3.2}Bi_2$ Zintl phase compound comprises a ZT of about 0.9 at about 350 K. In some embodiments, of the thermoelectric material, the $Mg_3Bi_2$-based Zintl phase compound comprises a Seebeck coefficient of about $-100\ \mu V\ K^{-1}$ at about 350 K. In other embodiments of the thermoelectric material, the $Mg_3Bi_2$-based Zintl phase compound comprises a electron-to-hole weighted mobility ratio greater than 8. In some further embodiments, the $Mg_3Bi_2$-based Zintl phase compound comprises an enhanced thermoelectric performance.

In another embodiment of the thermoelectric material disclosed herein, the $Mg_3Bi_2$-based Zintl phase compound comprises a partial substitution of Bi, wherein the $Mg_{3.2}Bi_2$-based Zintl phase compound further comprises at least one of Sb, or Te. In another embodiment of the thermoelectric material the compound is $Mg_{3.2}Bi_{1.498}Sb_{0.5}Te_{0.002}$ and in a further embodiment of the thermoelectric material the $Mg_3Bi_2$-based Zintl phase compound is a n-type $Mg_{3.2}Bi_2$-based Zintl phase compound, and in a still further embodiment of the thermoelectric material the $Mg_3Bi_2$-based Zintl phase compound comprises a unicouple of n-type $Mg_{3.2}Bi_{1.498}Sb_{0.5}Te_{0.002}$ and p-type $Bi_{0.5}Sb_{1.5}Te_3$. In some embodiments of the thermoelectric material, the unicouple comprises a temperature difference of ~91 K and a hot-side temperature of ~350 K.

In other embodiments, the unicouple comprises a thermoelectric legs, and wherein the thermoelectric legs comprise an enhanced cooling performance, and in some embodiments the thermoelectric material comprising a further contact material.

In other embodiments of the thermoelectric material, the contact material is at least one of Fe, Ni, or Cu; in another embodiment the contact material is Fe; and in a further embodiment thermoelectric legs comprise $Fe/Mg_{3.2}Bi_{1.49}Sb_{0.5}Te_{0.002}/Fe$. In some embodiments of the thermoelectric material, the thermoelectric material is a pure phase material. In other embodiments, the power factor of the thermoelectric material is between about 20 $\mu W\ cm^{-1}\ K^{-2}$ and about 25 $\mu W\ cm^{-1}\ K^{-2}$ over a temperature range of about 200 K to 350 K; electrical resistivity of the thermoelectric material is from more than $0.58\mu\Omega{*}m$ to less than 9 $\mu\Omega{*}m$ from about 2 K to about 300K; and in some embodiments the thermal conductivity of the thermoelectric material is about 2.8 $W\ m^{-1}\ K^{-1}$ at about 300 K. In another embodiment of the thermoelectric material, the $Mg_3Bi_2$-based Zintl phase compound comprises a Seebeck coefficient of about $-107\ \mu V\ K^{-1}$ at about 350 K; and in a further embodiment of the thermoelectric material, the compound has a narrow band gap of between about 0.16 and about 0.26 eV at room temperature.

BRIEF DESCRIPTION OF THE DRAWINGS

For a detailed description of the disclosed embodiments, reference will now be made to the accompanying drawings, wherein:

FIG. 14 depicts the calculated average power factor of $Mg_{3.2}Bi_{1.998-x}Sb_xTe_{0.002}$ between 2 K and 350 K;

FIG. 15 depicts the thermal conductivity of $Mg_{3.2}Bi_{1.998-x}Sb_xTe_{0.002}$;

NOTATION AND NOMENCLATURE

Figure 1A:
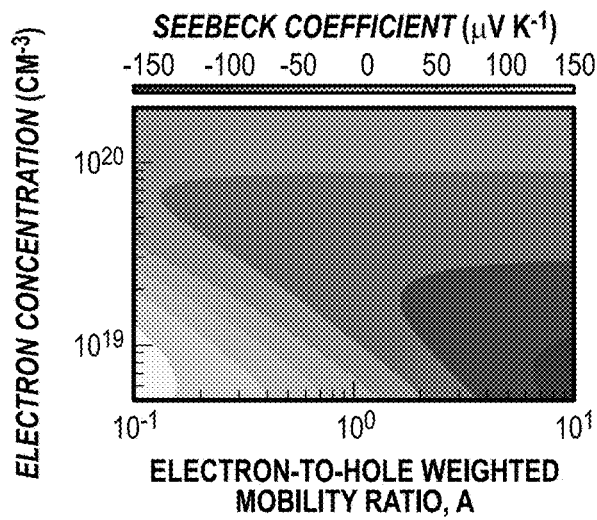
FIG. 1(a) depicts the electron concentration and electron-to-hole weighted mobility ratio dependent Seebeck coefficient of a n-type semi-metal with a zero bandgap at 300 K.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION OF THE DISCLOSED EXEMPLARY EMBODIMENTS

The following discussion is directed to various exemplary embodiments of the invention. Although one or more of these embodiments may be preferred, the embodiments disclosed herein are merely examples and should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment. In the following discussion and in the claims, the terms "including" and "comprising" are used in an open-ended fashion, and thus should be interpreted to mean "including, but not limited to . . . ." As used herein, the term "about," when used in conjunction with a percentage or other numerical amount, means plus or minus 10% of that percentage or other numerical amount. For example, the term "about 80%," would encompass 80% plus or minus 8%. References cited herein are incorporated in their entirety by such reference.

The present disclosure provides for new thermoelectric materials, i.e., $Mg_3Bi_2$-based Zintl phase compounds, wherein it has been discovered that the semi-metallic $Mg_{3.2}Bi_2$ (nominal composition) described herein show an unexpectedly large Seebeck coefficient of −107 μV K$^{-1}$ at 350 K and enhanced thermoelectric performance.

Such a high Seebeck coefficient may be attributed to the very large electron-to-hole weighted mobility ratio above 8. By partial substitution of Bi with Sb, the thermoelectric performance of $Mg_{3.2}Bi_2$-based materials was substantially improved. The optimized $Mg_{3.2}Bi_{1.498}Sb_{0.5}Te_{0.002}$ shows a peak ZT of ~0.9 at 350 K. The n-type $Mg_{3.2}Bi_2$-based materials are proposed for thermoelectric cooling applications. A unicouple of n-type $Mg_{3.2}Bi_{1.498}Sb_{0.5}Te_{0.002}$ and p-type $Bi_{0.5}Sb_{1.5}Te_3$ was thus prepared and a large temperature difference of ~91 K can be realized with the hot-side temperature of ~350 K. Such a cooling performance is even better than the commercial legs consisting of n-type $Bi_2Te_{2.7}Se_{0.3}$ and p-type $Bi_{0.5}Sb_{1.5}Te_3$ (Mao, J. et al., Science, Vol. 365, Issue 6452, pp. 495-498, 2019; Zu et al., Sci. Adv. 2019; 5, 5:eaav5813, are incorporated herein in its entirety).

Again, embodiments of $Mg_{3.2}Bi_2$-based thermoelectric materials demonstrate a high ZT of ~0.9 at 350 K. Such a high performance is better than the state-of-the-art n-type Bi$_2$Te$_{2.7}$Se$_{0.3}$, and further minimization of the contact resistance remains to be a challenge for the nanostructured Bi$_2$Te$_{2.7}$Se$_{0.3}$ of the prior art. In comparison, it has been found herein, that Fe is a good contact material for n-type Mg$_{3.2}$Bi$_2$-based materials in order to fabricate the Fe/Mg$_{3.2}$Bi$_{1.498}$Sb$_{0.5}$Te$_{0.002}$/Fe thermoelectric legs (Many other elements can also be used as contact materials such as Ni, Cu, etc.). Additionally, the Mg$_{3.2}$Bi$_2$-based materials are much cheaper than Bi$_2$Te$_{2.7}$Se$_{0.3}$ due to the higher price of Te. Therefore, replacing Bi$_2$Te$_{2.7}$Se$_{0.3}$ with the Mg$_{3.2}$Bi$_2$-based materials can significantly reduce the cost of thermoelectric module.

Due to the excellent cooling performance of the n-type Mg$_{3.2}$Bi$_2$-based materials disclosed herein, and their advantages over Bi$_2$Te$_{2.7}$Se$_{0.3}$, the n-type Mg$_{3.2}$Bi$_2$-based materials paired with the existing p-type Bi$_2$Te$_3$-based materials can potentially change the landscape of cooling applications by using thermoelectric modules.

The n-type Mg$_{3.2}$Bi$_2$-based materials with various compositions were thus prepared herein, and their thermoelectric properties characterized. The unicouple of n-type Mg$_{3.2}$Bi$_{1.498}$Sb$_{0.5}$Te$_{0.002}$ and p-type Bi$_{0.5}$Sb$_{1.5}$Te$_3$ were also prepared. The thermoelectric cooling measurement shows that a large temperature difference of ~91 K can thus be realized when the hot-side temperature is around 350 K.

In order to elucidate the technologies described herein: solid-state thermoelectric energy conversion holds great promises for power generation as well as thermal management[14]. The energy conversion efficiency of a thermoelectric module largely relies on the performance of the materials used, which is governed by the dimensionless figure of merit (ZT). ZT=$S^2\sigma T/\kappa$, where S is the Seebeck coefficient, $\sigma$ the electrical conductivity, K the thermal conductivity, and T the absolute temperature[5-11].

When a thermoelectric material is applied at a certain temperature, electrons in the valence band can be thermally activated into the conduction band, freeing an equal number of holes in the valence band. Since electrons and holes contribute oppositely to the Seebeck coefficient, it will be greatly diminished by such a bipolar conduction, which will also deteriorate the thermoelectric performance. Because the activation of electrons requires sufficient thermal energy (which depends on temperature) to cross the bandgap, the bandgap energy (E$_g$) plays a decisive role in bipolar conduction[12]. As a result, most of the good thermoelectric materials reported thus far have been semiconductors (with a finite bandgap).

The optimum bandgap for thermoelectric materials has been predicted to be in the range between 6k$_B$T and 10k$_B$T (i.e., in the range between ~0.16 and ~0.26 eV at room temperature), where k$_B$ is the Boltzmann constant[13-15]. It should be noted that the conventional wisdom based on the assumption that the band effective masses (m*) and carrier mobilities (p) are comparable for electrons and holes, i.e., m$_c$*=m$_h$* and $\mu_c$=$\mu_h$[13]. However, in a more complicated scenario where the transport properties are asymmetrical, i.e., m$_c$*≠m$_h$* and $\mu_c$≠$\mu_h$, the optimal bandgap will be different.

Such asymmetrical thermoelectric properties can be quantified by the electron-to-hole weighted mobility ratio $$A = (N_e m_e^{*3/2} \mu_e)/(N_h m_h^{*3/2} \mu_h)^{[11,16-18]},$$

where N is the valley degeneracy. Therefore, the effect of bipolar conduction on thermoelectric performance when the transport properties are asymmetrical is of importance. When bipolar conduction occurs, the contributions from electrons and holes should both be considered and the Seebeck coefficient can be expressed as:

$$S = \frac{(\sigma_e S_e + \sigma_h S_h)}{(\sigma_e + \sigma_h)} = \frac{1}{\left(1 + \frac{\sigma_h}{\sigma_e}\right)} \left(S_e + \frac{\sigma_h}{\sigma_e} S_h\right), \quad (1)$$

where S$_e$ and S$_h$ are the partial Seebeck coefficients for electrons and holes, respectively, and $\sigma_e$ and $\sigma_h$ are the partial electrical conductivities for electrons and holes, respectively. By applying the two-band model (i.e., considering one conduction band and one valence band), Eq. (1) can be rewritten as[11]

$$S = \frac{1}{\left\{1 + \frac{F_{1/2}[-(\xi_e + \xi_g)]}{AF_{1/2}(\xi_e)}\right\}} \times \quad (2)$$

$$\left\{ \begin{array}{l} -\frac{k_B}{e}\left[\frac{(r+5/2)F_{r+3/2}(\xi_e)}{(r+3/2)F_{r+1/2}(\xi_e)} - \xi_e\right] + \\ \frac{F_{1/2}[-(\xi_e + \xi_g)]}{AF_{1/2}(\xi_e)} \frac{k_B}{e}\left[\frac{(r+5/2)F_{r+3/2}[-(\xi_e + \xi_g)]}{(r+3/2)F_{r+1/2}[-(\xi_e + \xi_g)]} + (\xi_e + \xi_g)\right] \end{array} \right\},$$

where F is the Fermi integral, e is the elementary charge, r is the scattering parameter, $\xi_e$ is the conduction band reduced Fermi energy, and $\xi_g$ is the reduced bandgap energy ($\xi_g=\xi_g/k_BT$).

According to Eq. (2), the Seebeck coefficient depends on the carrier concentration ($\xi_e$), bandgap ($\xi_g$), electron-to-hole weighted mobility ratio (A), and carrier scattering mechanism (r). It is well known that increasing the bandgap energy (i.e., increasing ($\xi_g$) and increasing the concentration of majority carriers (e.g., increasing $\xi_e$ for n-type materials) can effectively suppress the bipolar conduction. In contrast, the importance of the electron-to-hole weighted mobility ratio (A) and carrier scattering mechanism (r) on bipolar conduction has not yet been fully recognized. In fact, preferential scattering of minority carriers (i.e., tuning the scattering mechanism) has been considered as a possible strategy for suppressing bipolar conduction, embodwe will mainly limit the discussion to the relationship among the electron-to-hole weighted mobility ratio, the Seebeck coefficient, and bipolar conduction.

Early studies addressing the weighted mobility ratio were mainly focused on its impact on the Goldsmid-Sharp bandgap[16-18]. To clearly demonstrate its effect on the Seebeck coefficient, the electron concentration and the electron-to-hole weighted mobility ratio dependent Seebeck coefficient were calculated herein for a n-type semi-metal with a zero bandgap at 300 K.

As shown in FIG. 1, the Seebeck coefficient is nearly independent of the electron-to-hole weighted mobility ratio when electron concentration is high (e.g., above 10$^2$ cm$^{-3}$). In this case, the concentration of majority carriers (i.e., electrons) exponentially outnumbers that of the minority carriers (i.e., holes) and the Seebeck coefficient will be dominated by the contribution of electrons. The electron-to-hole weighted mobility ratio plays a vital role in determining the Seebeck coefficient when the electron concentration is relatively low (e.g., around 5×10$^{18}$ cm$^{-3}$). At such a low electron concentration, the bipolar conduction is usually very noticeable, especially for a semi-metal. Indeed, the Seebeck coefficient is rather low (with an absolute value of less than 30 μV K$^{-1}$) when the weighted mobility ratio is around unity, which indicates that the transport properties are symmetrical between the conduction and valence bands. This means that the contribution from electrons has been almost offset by that from holes, i.e., a strong bipolar conduction effect. In a sharp contrast, a high Seebeck coefficient (with an absolute value above 100 μV K$^{-1}$) can be achieved when the transport properties are highly asymmetrical, i.e., A>>1 or A<<1. Specifically, a large negative Seebeck coefficient can be obtained for n-type materials when A>>1 and a large positive Seebeck coefficient can be realized by p-type materials when A<<1. In other words, highly asymmetrical transport properties are quite beneficial for suppressing bipolar conduction in the conduction type with good thermoelectric performance. Conversely, noticeable bipolar conduction will occur in the conduction type with inferior thermoelectric performance. Eventually, this will lead to highly asymmetrical thermoelectric performance between the n- and p-type of a given material (U.S. Pat. Nos. 7,465,871; 8,293,168; and 9,011,763 are herein incorporated in their entirety by reference).

Figure 1B:
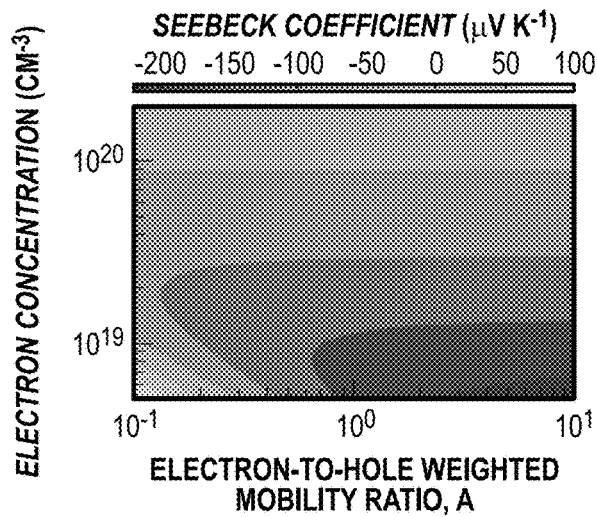
FIG. 1(b) depicts the electron concentration and electron-to-hole weighted mobility ratio dependent Seebeck coefficient of a n-type semiconductor with a bandgap of 0.08 eV at 300 K.
Figure 1C:
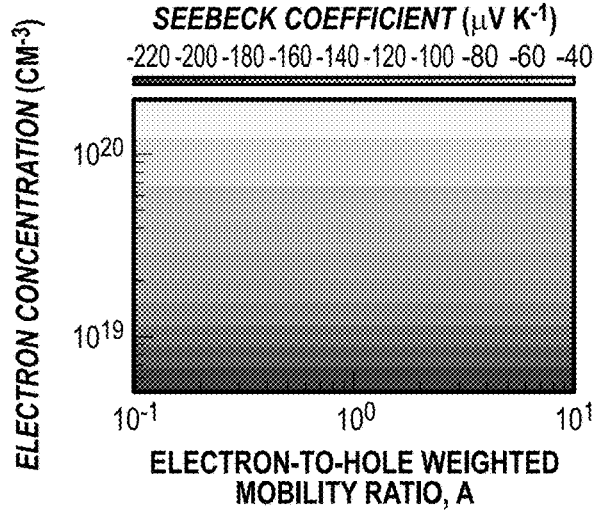
FIG. 1(c) depicts the electron concentration and electron-to-hole weighted mobility ratio dependent Seebeck coefficient of a n-type semiconductor with a bandgap of 0.3 eV at 300 K.

Modelling was also conducted for semiconductors with different bandgap energies as shown in FIG. 1(b) and FIG. 1(c). Similarly, the weighted mobility ratio plays a pivotal role in the Seebeck coefficient of the semiconductors with a very narrow bandgap (FIG. 1(b)). When the bandgap energy is large enough (e.g., $E_g$>10$k_B$T), bipolar conduction will be negligible and Seebeck coefficient is independent of the weighted mobility ratio (FIG. 1(b)). It should be reiterated that all of the modelling was performed at 300 K. At elevated temperature (e.g., 700 K or above), noticeable bipolar conduction will occur (for semi-metals and semiconductors with a very narrow bandgap) even when the weighted mobility ratio has an extreme value. Therefore, these models indicate that the semi-metals or semiconductors with a very narrow bandgap (e.g., $E_g$ less than ~0.1 eV) could demonstrate exceptional thermoelectric performance up to room temperature when the weighted mobility ratio has an extreme value.

Recently, n-type $Mg_3Sb_2$-based Zintl phases have emerged as highly promising thermoelectric materials[22-36]. Unlike the semiconducting $Mg_3Sb_2$, the isostructural $Mg_3Bi_2$ is a semi-metal[37-39]. Experimentally, $Mg_3Bi_2$ prepared with the exact stoichiometry shows p-type conduction (FIG. 6 (b), which is in good agreement with the previous reports[37-38]. Such a persistent p-type conduction should be attributed to the presence of a high concentration of Mg vacancies, which is similar to $Mg_3Sb_2$[22-31].

Herein, n-type $Mg_3Bi_2$ samples with excess Mg in nominal composition was successfully synthesized, i.e., $Mg_{3+δ}Bi_2$ (δ=0.05, 0.1, and 0.2, throughout the disclosure all the compositions are nominal to compensate the loss of Mg during sample preparation) and it was found that the thermoelectric properties are very similar to one another (FIG. 6 (a)-(f), hence in one embodiment the base composition of $Mg_{3.2}Bi_2$ was chosen for study.

Figure 2A:
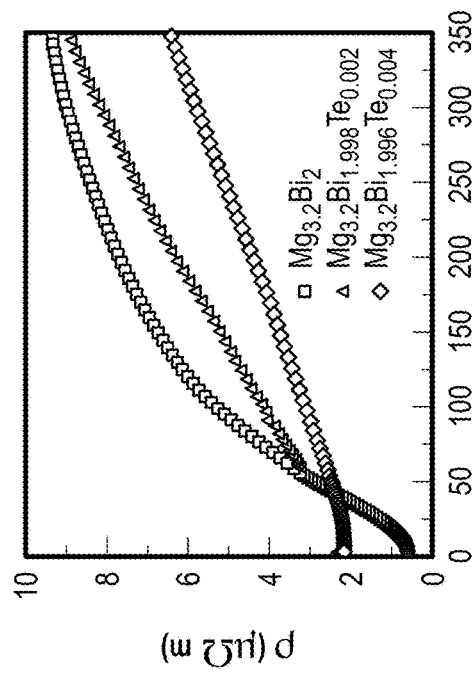
FIG. 2. Depicts (a) the carrier concentration (the upper panel) and mobility (the lower panel) of $Mg_{3.2}Bi_2$. (b) Electrical resistivity, (c) Seebeck coefficient, and (d) power factor of $Mg_{3.2}Bi_{2-x}Te_x$ (x=0, 0.002, and 0.004). The Seebeck coefficient of polycrystalline Bi is plotted in (c) for comparison.

The measured carrier concentration of $Mg_{3.2}Bi_2$ is ~2.1× 10$^{19}$ cm$^{-3}$ at 10 K (FIG. 2a, the upper panel) and it increases noticeably with temperature when the temperature is above 150 K. In addition, the carrier mobility of $Mg_{3.2}Bi_2$ is more than 200 cm$^2$ V$^{-1}$ s$^{-1}$ when the temperature is below 300 K and it is as high as ~4198 cm$^2$ V$^{-1}$ s$^{-1}$ at 10 K (FIG. 2a, the lower panel).

The high carrier concentration and mobility in conjunction with the low bipolar conduction temperature clearly indicate the semi-metallic characteristic of $Mg_{3.2}Bi_2$.

Benefiting from the high carrier concentration and mobility, the electrical resistivity of $Mg_{3.2}Bi_2$ is only ~9 μΩ m at 300 K and it is as low as ~0.58 μΩ m at 2 K (FIG. 2 (b)). Surprisingly, the Seebeck coefficient of $Mg_{3.2}Bi_2$ is more than −80 μV K$^{-1}$ over a broad temperature range between 130 K and 350 K and a high Seebeck coefficient of ~105 μV K$^{-1}$ can be achieved at room temperature.

Elemental bismuth is a classic semi-metal with good thermoelectric performance (FIG. 7 (a)-(d))[40-44]. High-purity single-crystalline bismuth shows n-type conduction with a large room-temperature Seebeck coefficient around −100 μV K$^{-1}$ along the trigonal axis and around −50 μV K$^{-1}$ in the direction perpendicular to the trigonal axis[41, 42].

Figure 2B:
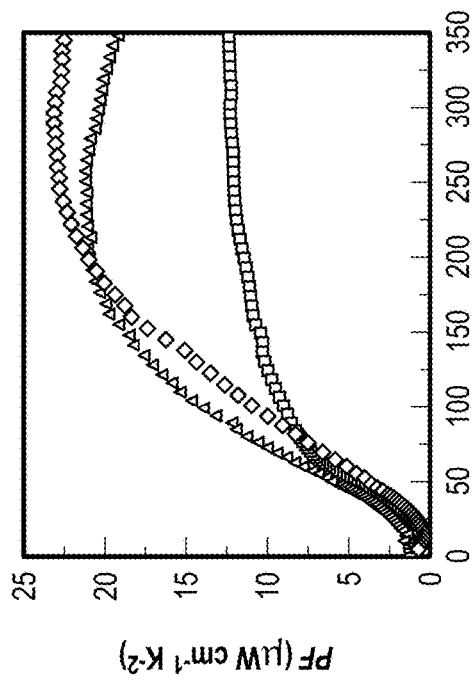
Figure 2C:
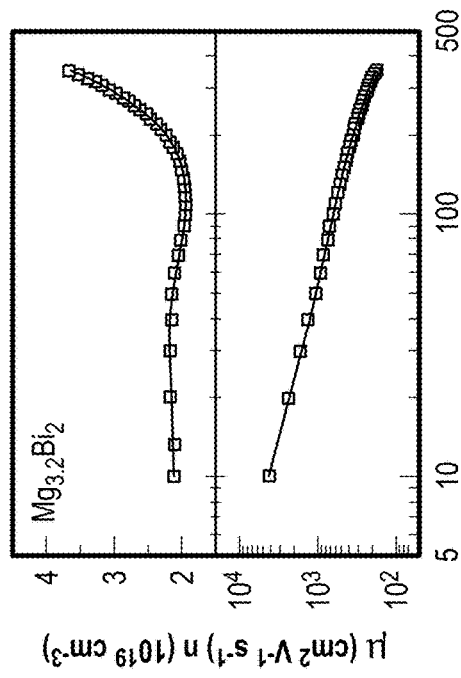
Figure 2D:
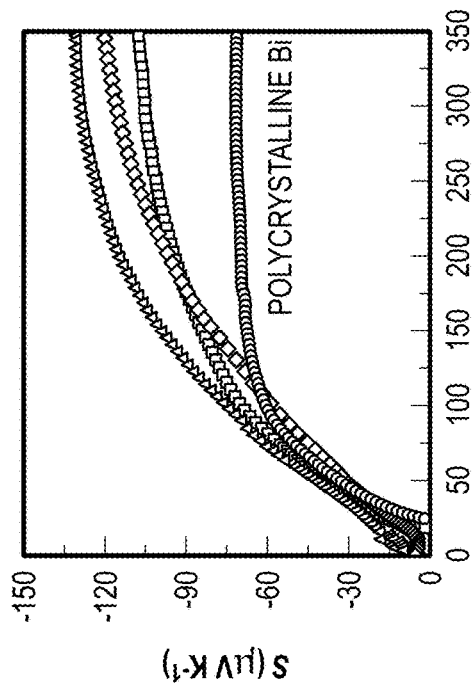
Figure 8A:
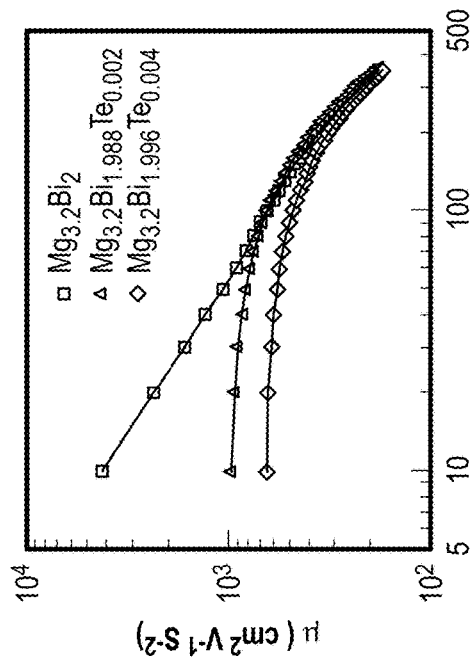
FIG. 8. (a) depicts the carrier concentration and (b) mobility of $Mg_{3.2}Bi_{2-x}Te_x$ (x=0, 0.002, and 0.004)
Figure 8B:
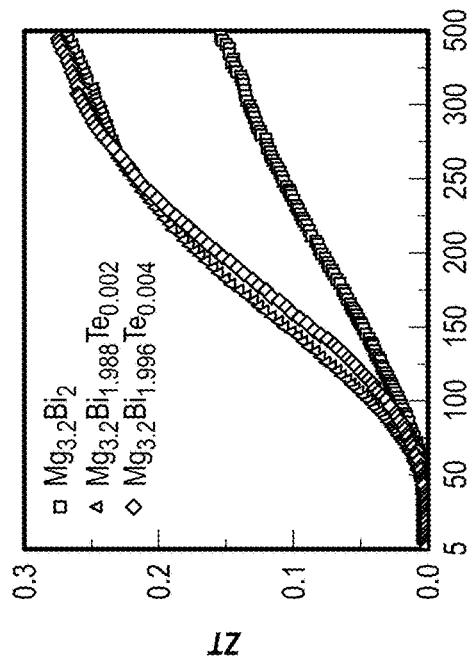

Polycrystalline bismuth (light green symbols in FIG. 2(c) exhibits a Seebeck coefficient about −70 μV K$^{-1}$ at 300 K, which is lower than that of the polycrystalline $Mg_{3.2}Bi_2$ sample prepared in this work. Combined with the low electrical resistivity and the unexpectedly large Seebeck coefficient, $Mg_{3.2}Bi_2$ can achieve a power factor ~10 μW cm$^{-1}$ K$^{-2}$ across a broad temperature range (FIG. 2(d)). Additionally, minute Te doping can effectively modulate the carrier concentration of $Mg_{3.2}Bi_2$ (FIG. 8(a)-(b)), thus reducing the electrical resistivity and slightly enhancing the Seebeck coefficient (FIG. 2b and FIG. 2c, respectively). As a result, substantially higher power factors on the order of ~20 μW cm$^{-1}$ K$^{-2}$ over a broad temperature range can be realized in Te-doped $Mg_{3.2}Bi_2$ (FIG. 2d). Finally, a peak ZT around 0.3 at 350 K can be obtained by $Mg_{3.2}Bi_{1.998}Te_{0.002}$ and the ZT is above 0.1 down to 150 K (FIG. 9(b)). The average ZT (calculated by the integration method) between 100 K and 350 K is ~0.2 for $Mg_{3.2}Bi_{1.998}Te_{0.002}$ and ~0.2 for $Mg_{3.2}Bi_{1.996}Te_{0.004}$.

Figure 3A:
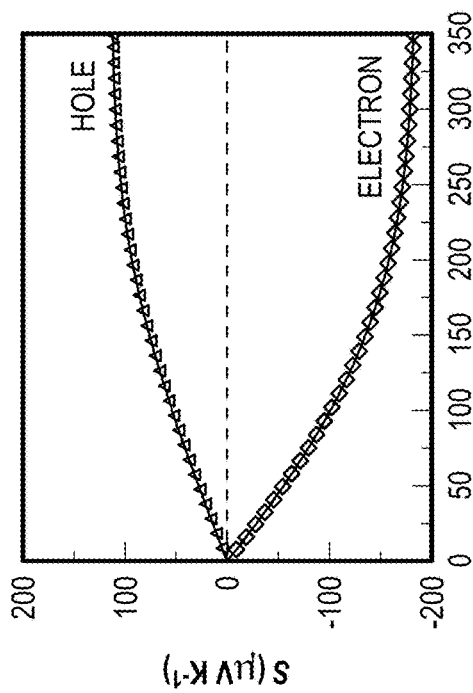
FIG. 3. Depicts (a) the calculated band structure of $Mg_3Bi_2$ with the band overlap shifted to −0.1 eV. (b) Partial Seebeck coefficients of electrons and holes, (c) electron and hole mobilities, and (d) electron-to-hole weighted mobility ratio for $Mg_{3.2}Bi_2$.
Figure 3C:
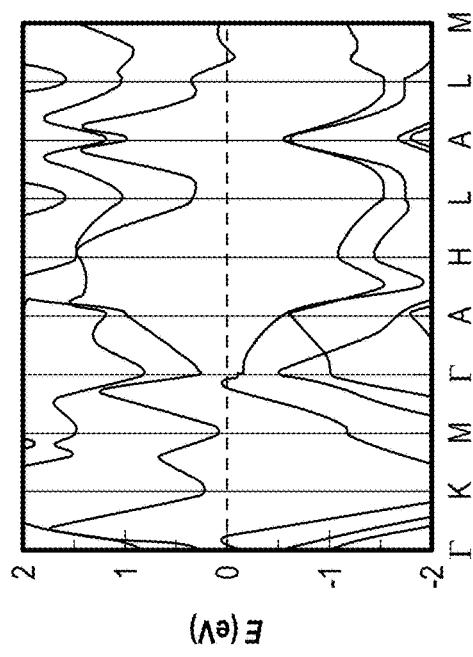
Figure 10A:
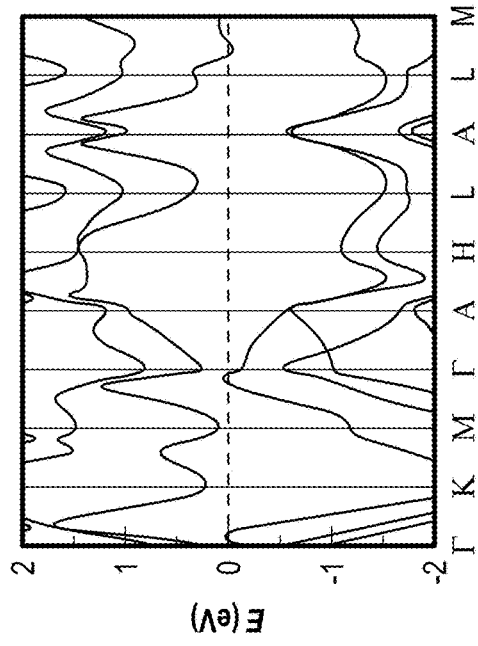
FIG. 10. (a) depicts calculated band structure, (b) the band structure with the band overlap energy shifted to −0.1 eV.
Figure 10B:
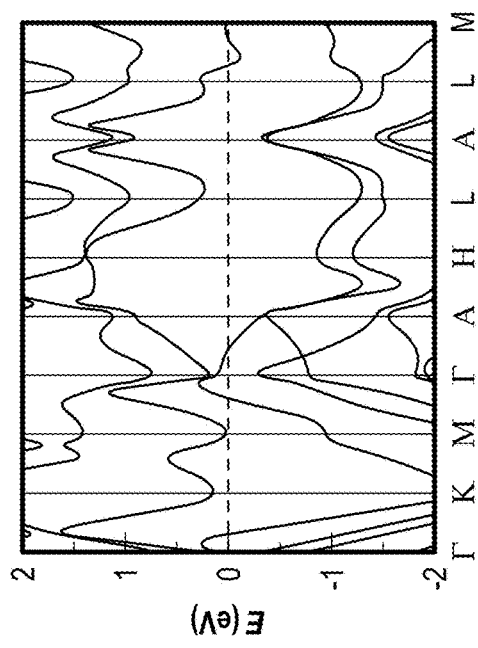
Figure 12A:
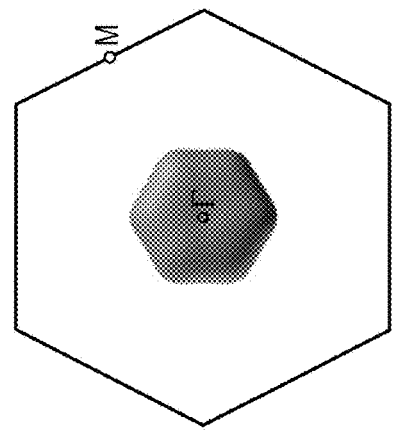
FIG. 12 depicts the calculated Fermi surfaces of (a) conduction and (b) valence bands of $Mg_3Bi_2$.
Figure 12B:
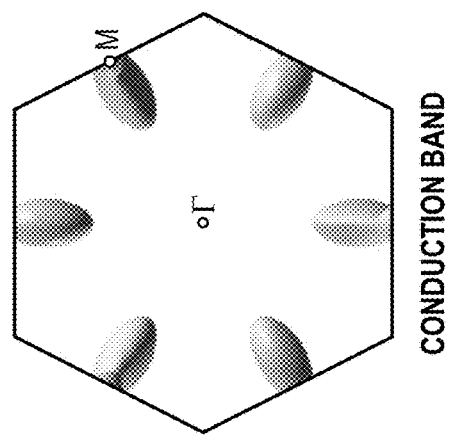
Figure 11:
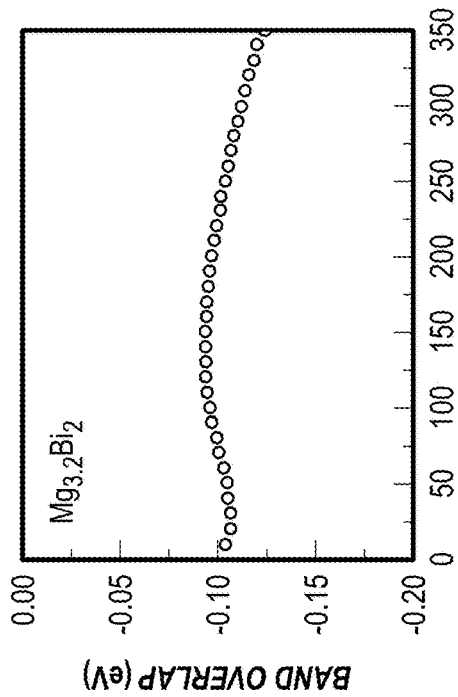
FIG. 11. depicts the calculated band overlap of $Mg_{3.2}Bi_2$ from the two-band modelling.
Figure 13B:
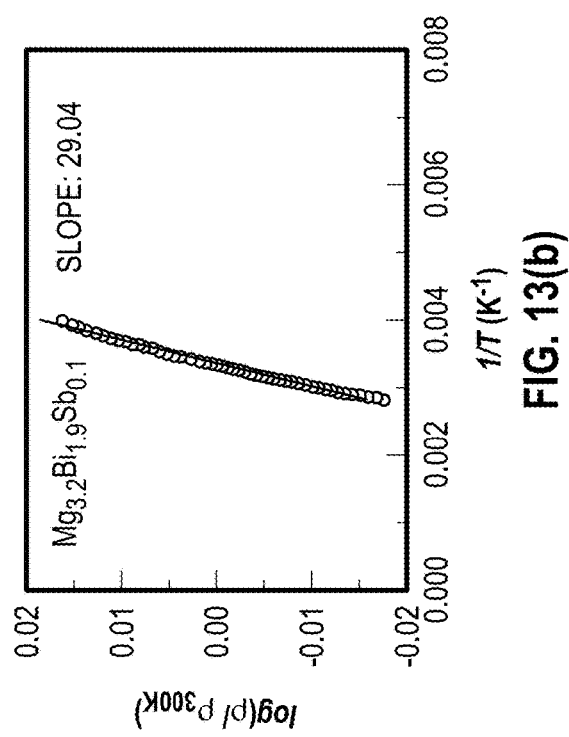
FIG. 13 depicts the temperature-dependent electrical resistivity of $Mg_{3.2}Bi_{2-x}Sb_x$ (x=0, 0.1, 0.2, 0.3, 0.4, 0.5, 0.6, and 0.7)
Figure 13D:
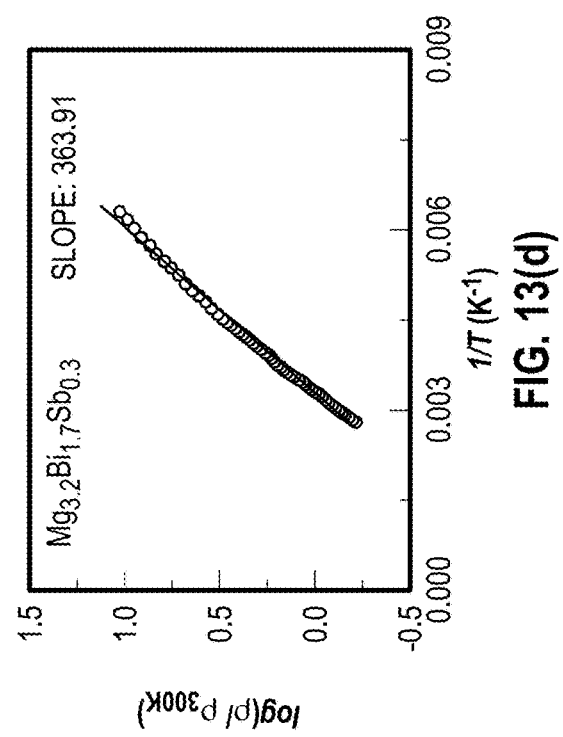
Figure 13A:
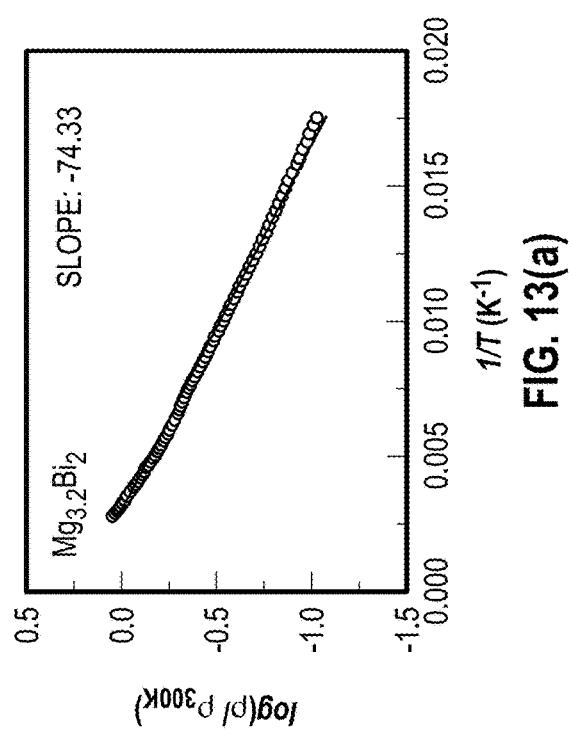
Figure 13C:
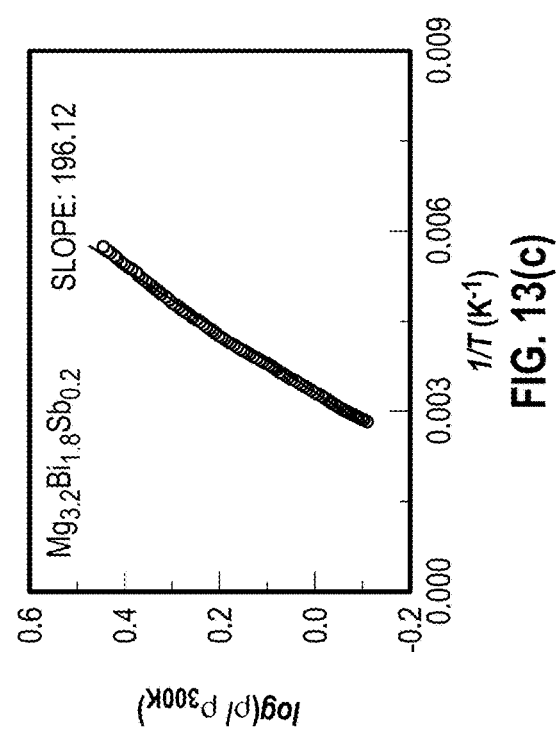
Figure 13E:
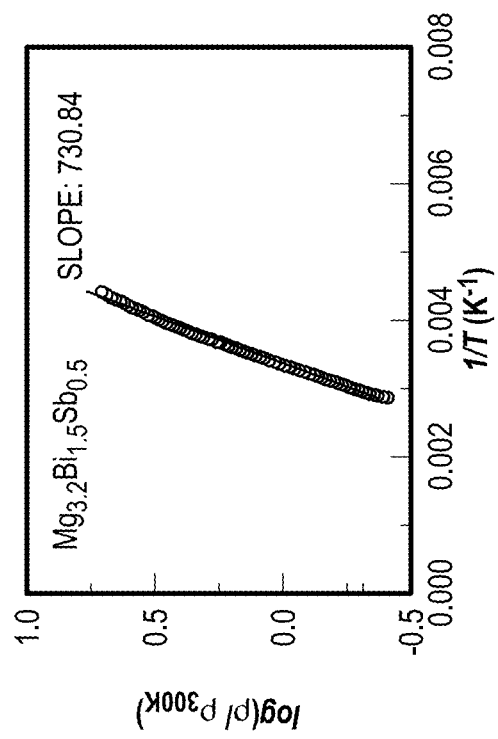
Figure 13F:
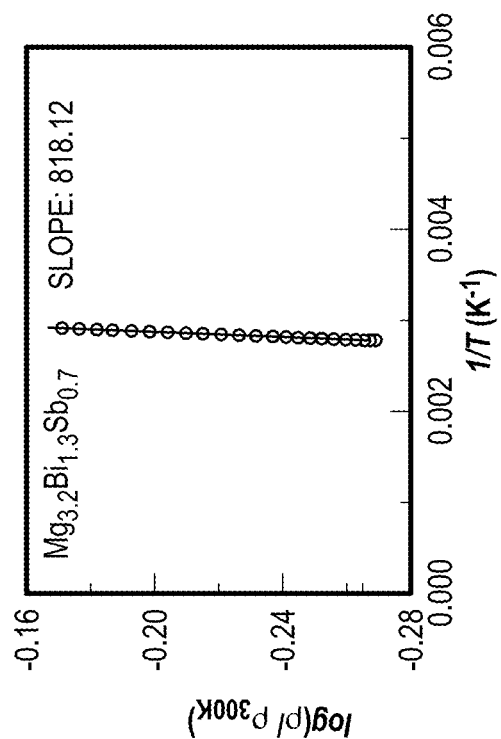
Figure 13G:
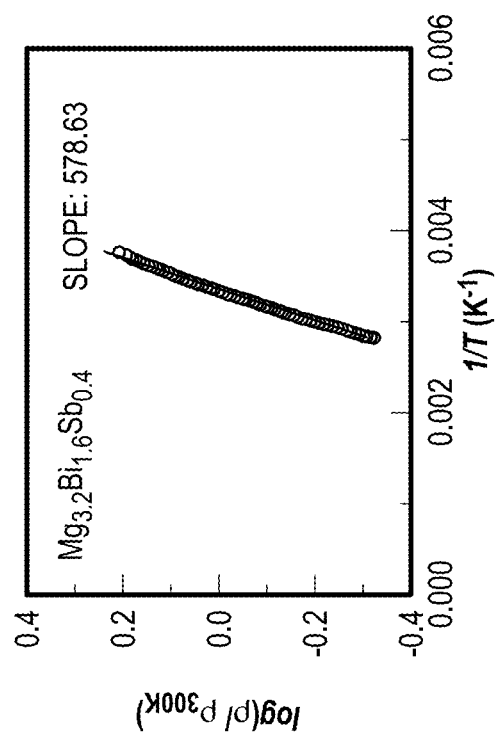
Figure 13H:
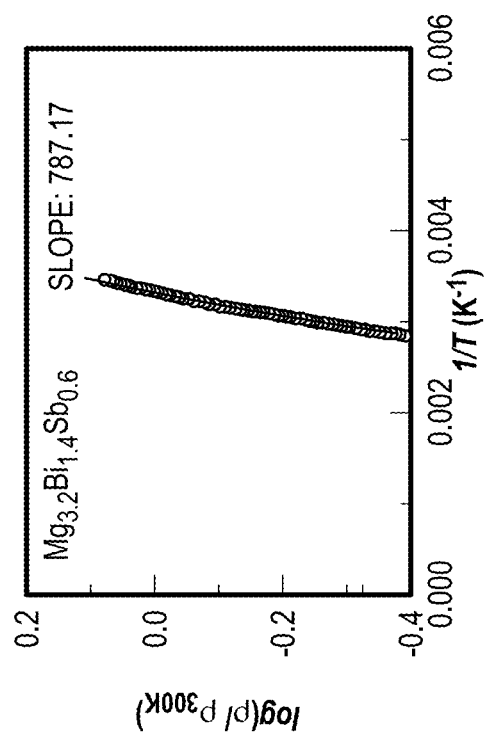

To understand the electronic properties of $Mg_3Bi_2$, its band structure was calculated as shown in FIG. 10 (a). The calculated band overlap energy between the conduction band minimum and valence band maximum is around −0.4 eV. However, the estimated band overlap from the two-band modelling is about −0.1 eV (FIG. 11), therefore the calculated band structure with the band overlap energy shifted to −0.1 eV is shown in FIG. 3a. It can be seen that the conduction band minimum is located along the L-M line with the valley degeneracy of 6 (FIG. 12 (a)) and the valence band maximum locates around F point with the valley degeneracy of 1 (FIG. 12(b)). It should be noted that different band structures were previously reported for $Mg_3Bi_2$[23, 39, 45] and the difference can be attributed to the choice of pseudo-potential and whether the spin-orbital coupling is considered[39, 45]. As mentioned above, the unexpectedly large Seebeck coefficient in the n-type semi-metallic $Mg_{3.2}Bi_2$ is essential for its good thermoelectric performance. To reveal the underlying mechanism of the high Seebeck coefficient, a two-band model (i.e., one conduction band along the L-M line and one valence band around F point) was applied to calculate the partial Seebeck coefficients and carrier mobilities for $Mg_{3.2}Bi_2$[11].

Figure 3B:
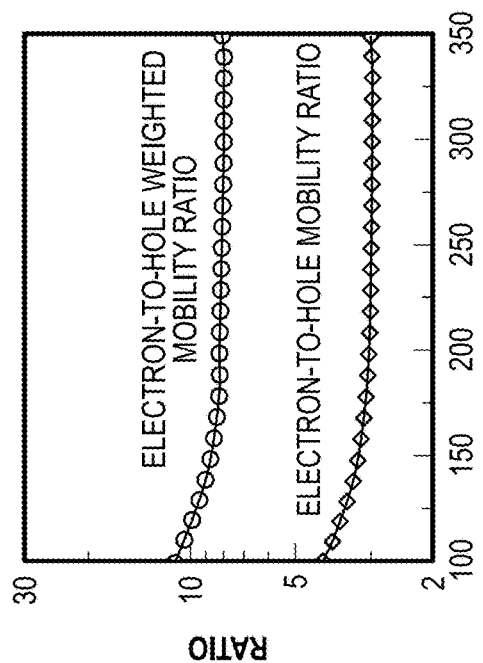
Figure 3D:
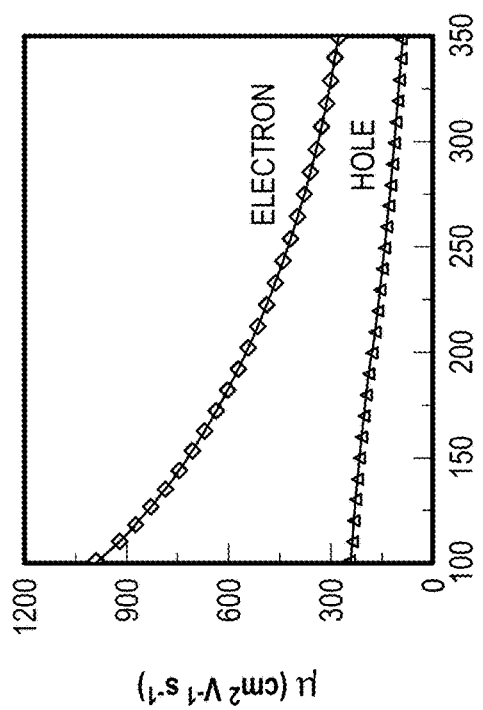

The partial Seebeck coefficients for electrons and holes of $Mg_{3.2}Bi_2$ were calculated as shown in FIG. 3b. The partial Seebeck coefficient of electrons is noticeably larger than that of holes. The difference in the partial Seebeck coefficients should be attributed to the disparity in the density-of-states effective mass $m_d^*$.

The calculated $m_d^*$ is ~0.530 $m_0$ for the conduction band and ~0.276 $m_0$ for the valence band (Table 1).

TABLE 1

Effective mass of $Mg_3Bi_2$. Band effective mass (m*) is calculated as $$m^* = \sqrt[3]{m_{xx}m_{yy}m_{zz}}$$

and the inertial effective mass is calculated as $m_I^* = 3/(1/m_{xx} + 1/m_{yy} + 1/m_{zz})$.

|  | $m_{xx}$ | $m_{yy}$ | $m_{zz}$ | m* | $m_I^*$ | $m_d^*$ |
|---|---|---|---|---|---|---|
| Conduction band at M-L Line | 0.098 | 0.418 | 0.101 | 0.161 | 0.133 | 0.530 |
| Valence band | 0.403 | 0.299 | 0.175 | 0.276 | 0.259 | 0.276 |

The density-of-states effective mass depends on the band effective mass (m*) as well as the valley degeneracy (N) according to the relation of $$(m^*)^{-3/2}(m_1^*)^{-1},$$

Figure 9A:
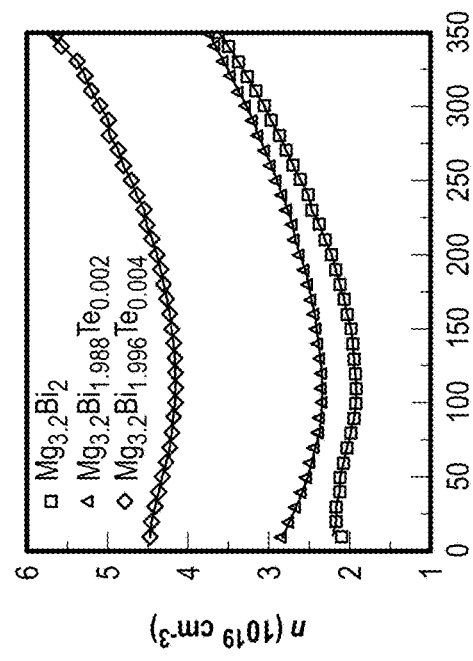
FIG. 9. (a) depicts the thermal conductivity and (b) ZT of $Mg_{3.2}Bi_{2-x}Te_x$ (x=0, 0.002, and 0.004)
Figure 9B:
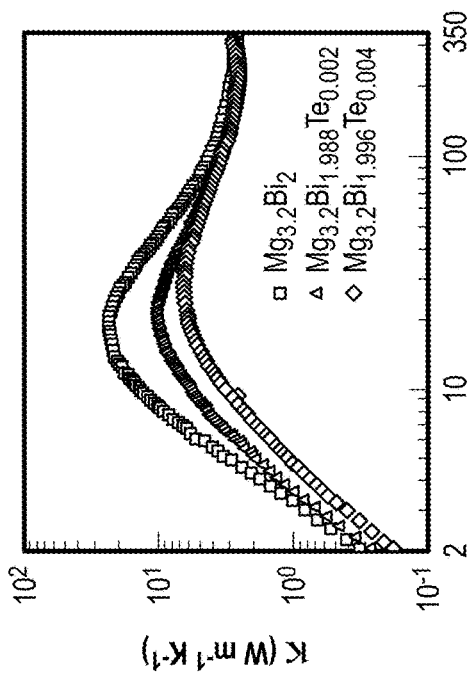

The different valley degeneracies in the conduction and valence bands (FIG. 9(a)-(b)) can account for the disparity in the density-of-states effective mass. The partial carrier mobilities of $Mg_{3.2}Bi_2$ (in the range between 100 K and 350 K) were further calculated as shown in FIG. 3 (c). It should be pointed out that the calculated partial mobilities have relatively large uncertainties when temperature is below 100 K due to the small absolute value of Seebeck coefficient, therefore these values are not shown in FIG. 3 (c). It can be seen that the electron mobility is noticeably higher than the hole mobility. When acoustic phonon scattering is the predominant scattering process, the carrier mobility is proportional to $$m_d^* = N^{2/3}m^{*[12]}.$$

where $m_1^*$ is the inertial effective mass[5, 12, 46].

Therefore, low band effective mass and inertial effective mass are very beneficial for achieving a high carrier mobility. In fact, the calculated band effective mass is ~0.161 $m_0$ for electrons ($m_0$ is the free electron mass) and ~0.276 $m_0$ for holes and the inertial effective mass ($m_1^*$) is ~0.133 $m_0$ for electrons and ~0.259 $m_0$ for holes.

Therefore, the higher mobility of electrons compared to that of holes is very reasonable. As a result, the electron-to-hole mobility ratio is around 3 and the weighted mobility ratio is above 8 (FIG. 3 (d)). Such a large electron-to-hole weighted mobility ratio contributes to the high Seebeck coefficient of n-type $Mg_{3.2}Bi_2$. Meanwhile, it also partially explains why the p-type $Mg_3Bi_2$ shows a much lower Seebeck coefficient and inferior thermoelectric performance (FIG. 6). In other words, the transport properties of $Mg_3Bi_2$ are highly asymmetrical between the conduction and valence bands, thus leading to the noticeable difference in thermoelectric performance between the n- and p-type samples. It should also be noted that the electron-to-hole mobility ratio of single-crystalline bismuth is ~9.19 along the trigonal axis[41, 42, 47] and the density-of-states effective mass is ~0.113 $m_0$ for electrons and ~0.093 $m_0$ for holes[42]. As a result, the estimated electron-to-hole weighted mobility ratio is as large as ~11 along the trigonal axis for bismuth, which explains its high Seebeck coefficient along this direction. The highly asymmetrical transport properties of these semi-metals disclosed herein render embodiments thereof highly promising thermoelectric materials. The relatively high thermal conductivity (~2.8 W m$^{-1}$ K$^{-1}$ at 300 K, FIG. 9(a)) of $Mg_{3.2}Bi_2$ is the main limit to its thermoelectric performance. In fact, partial substitution of Bi with Sb in $Mg_{3.2}Bi_2$ should substantially reduce the lattice thermal conductivity and improve the thermoelectric performance. Based upon the composition $Mg_{3.2}Bi_{1.998}Te_{0.002}$, solid solutions with the nominal composition of $Mg_{3.2}Bi_{1.998-x}Sb_xTe_{0.002}$ (x=0, 0.1, 0.3, 0.5, and 0.7) were further prepared.

Figure 4E:
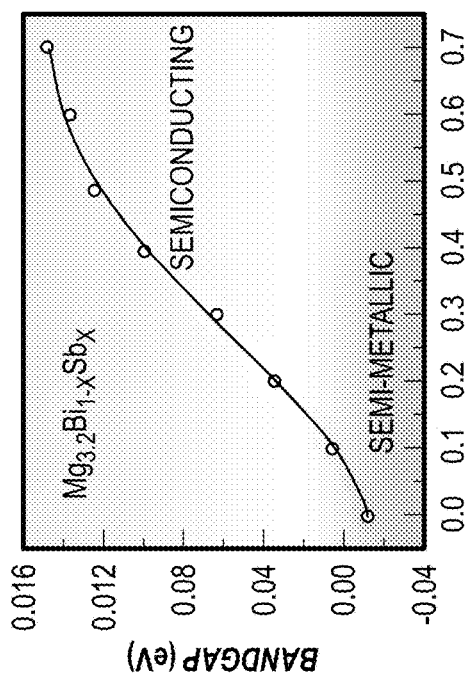
FIG. 4. Depicts the electronic thermoelectric properties of $Mg_{3.2}Bi_{1.998-x}Sb_xTe_{0.002}$. (a) Electrical resistivity, (b) Seebeck coefficient, (c) power factor, (d) carrier concentration, and (e) mobility. (f) Estimated bandgap of undoped $Mg_{3.2}Bi_{2-x}Sb_x$.

The electrical resistivity of $Mg_{3.2}Bi_{1.998-x}Sb_xTe_{0.002}$ gradually increases with increase Sb concentration (FIG. 4a). The electrical resistivity is ~8.2 μΩ m at 300 K and ~2.2 μΩ m around 2 K for $Mg_{3.2}Bi_{1.998}Te_{0.002}$. In comparison, it is ~24.4 μΩ m at 300 K and ~9.9 μΩ m around 2 K for $Mg_{3.2}Bi_{1.298}Sb_{0.7}Te_{0.002}$. The increased electrical resistivity can be attributed to the reduced carrier concentration (FIG. 4 (d)) and carrier mobility (FIG. 4(e)) after Sb alloying.

Figure 4F:
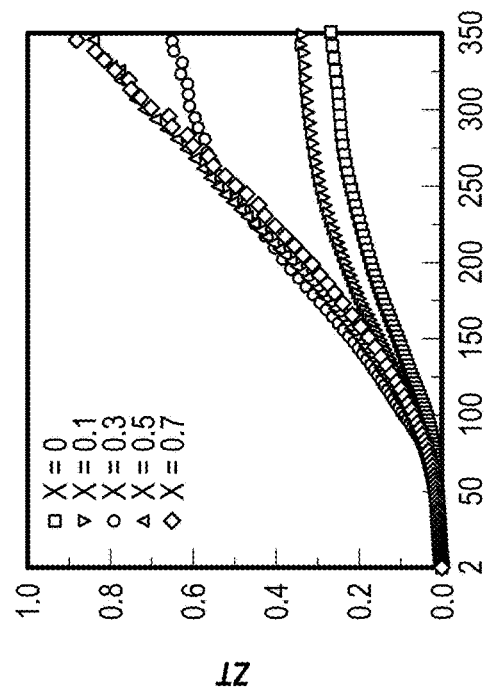

Similarly, the Seebeck coefficient is greatly enhanced with Sb alloying, as shown in FIG. 4(b). The room-temperature Seebeck coefficient is ~−129 μV K$^{-1}$ for $Mg_{3.2}Bi_{1.998}Te_{0.002}$ and it is ~−229 μV K$^{-1}$ for $Mg_{3.2}Bi_{1.298}Sb_{0.7}Te_{0.002}$, an enhancement of ~78%. The Seebeck coefficient enhancement should be ascribed to the reduced carrier concentration (FIG. 4 (d)) as well as the modified band structure after Sb alloying. Since $Mg_3Bi_2$ is a semi-metal while $Mg_3Sb_2$ is a semiconductor, it is very reasonable to expect a band structure transition from semi-metallic to semiconducting in $Mg_{3.2}Bi_{1.998-x}Sb_xTe_{0.002}$ solid solutions. To probe the variation in band structure after Sb alloying, the temperature-dependent electrical resistivity of undoped $Mg_{3.2}Bi_{2-x}Sb_x$ (x=0, 0.1, 0.2, 0.3, 0.4, 0.5, 0.6, and 0.7) was studied. The temperature-dependent electrical resistivity of $Mg_{3.2}Bi_{2-x}Sb_x$ can be described by the expression of $\rho=\rho_{300K} \exp(E_g/2k_B T)^{[48]}$, where $E_g$ is the band overlap energy (for a semi-metal) or the bandgap energy (for a semiconductor). Therefore, $E_g$ was determined for $Mg_{3.2}Bi_{2-x}Sb_x$ as shown in FIG. 4f (and derived by FIG. 13 (a)-(h)). Clearly, there is a semi-metallic to semiconducting transition with increasing Sb concentration.

The band overlap energy is about −0.013 eV for $Mg_{3.2}Bi_2$, and $Mg_{3.2}Bi_{1.9}Sb_{0.1}$ shows a nearly zero-gap (~0.005 eV). All of the samples with Sb concentration of more than 5% (i.e., x is above 0.1) are semiconducting and the bandgap increases with greater Sb concentration. The reported bandgap of $Mg_{3.2}Bi_{0.9}Sb_{1.1}$ is ~0.24 eVA[35] and that of $Mg_{3.2}Bi_{1.3}Sb_{0.7}$ is estimated to be ~0.147 eV in this work. Considering the lower Sb concentration in this composition, the estimated bandgap seems to be reasonable. It is also noted that the band overlap of $Mg_{3.2}Bi_2$ that estimated from the temperature-dependent electrical resistivity (around −0.013 eV) is smaller than the estimated value from the two-band modelling (around −0.1 eV, FIG. 3 (a) and FIG. 11) and the value derived from the calculated band structure (about −0.4 eV, FIG. 10 (a)). It suggests that the band overlap energy of $Mg_3Bi_2$ should be small. To unambiguously resolve this discrepancy, further characterization of the high quality single-crystalline $Mg_3Bi_2$ is necessary.

Such a semi-metal to semiconductor transition after Sb alloying can also be understood from the variation in the temperature dependence of carrier concentration (FIG. 4d). The carrier concentration of $Mg_{3.2}Bi_{1.998}Te_{0.002}$ and $Mg_{3.2}Bi_{1.898}Sb_{0.1}Te_{0.002}$ increases noticeably with temperature above 125 K, which is caused by the activation of electron-hole pairs due to the bipolar conduction. Such a phenomenon is greatly suppressed in $Mg_{3.2}Bi_{1.898}Sb_{0.3}Te_{0.002}$ and finally minimized in $Mg_{3.2}Bi_{1.498}Sb_{0.5}Te_{0.002}$ and $Mg_{3.2}Bi_{1.298}Sb_{0.7}Te_{0.002}$ due to the increased bandgap energy. In addition, the reduced carrier concentration in $Mg_{3.2}Bi_{1.998-x}Sb_xTe_{0.002}$ with increasing Sb concentration also indicates the downward shifting of the Fermi energies due to the variation in band structure (i.e., upward movement of conduction band edges that opens the bandgap). Despite the semi-metal to semiconductor transition after Sb alloying, the power factors among $Mg_{3.2}Bi_{1.998-x}Sb_xTe_{0.002}$ samples studied are comparable (FIG. 4 (*c*)). A slight enhancement in power factor can be observed in $Mg_{3.2}Bi_{1.898}Sb_{0.1}Te_{0.002}$ (with a bandgap of ~0.005 eV) and $Mg_{3.2}Bi_{1.698}Sb_{0.3}Te_{0.002}$ (with a bandgap of ~0.06 eV) compared to that of $Mg_{3.2}Bi_{1.998}Te_{0.002}$. When the Sb concentration is above 25% (i.e., x is above 0.5), power factors at lower temperature are notably reduced due to the substantially reduced carrier mobility (FIG. 4*e*). The average power factors of $Mg_{3.2}Bi_{1.998-x}Sb_xTe_{0.002}$ are further calculated by the integration method between 2 K and 350 K as shown in FIG. 14. High average power factors (above 16 $\mu W\ cm^{-1}\ K^{-2}$) can be achieved in the semi-metallic $Mg_{3.2}Bi_{1.998}Te_{0.002}$ and semiconducting $Mg_{3.2}Bi_{1.998-x}Sb_xTe_{0.002}$ (x<0.7) with very a narrow bandgap (less than 0.12 eV). As indicated by the above-mentioned modellings, semi-metals and semiconductors with a very narrow bandgap can achieved promising thermoelectric performance when the transport properties are highly asymmetrical (i.e., the large electron-to-hole weighted mobility ratio in $Mg_{3.2}Bi_2$-based materials).

Figure 5A:
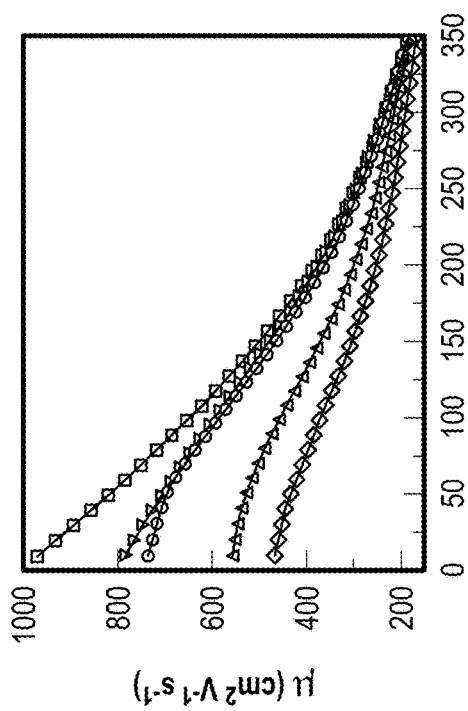
FIG. 5. Depicts (a) the lattice thermal conductivity and (b) ZT of $Mg_{3.2}Bi_{1.998-x}Sb_xTe_{0.002}$. (c) Experimental setup for the thermoelectric cooling measurement with a unicouple consisting of p-type $Bi_{0.5}Sb_{1.5}Te_3$ and n-type $Mg_{3.2}Bi_{1.498}Sb_{0.5}Te_{0.002}$. (d) Electrical current dependent temperature difference between the hot and cold sides at the hot-side temperature of ~350 K. The inset shows the comparison of hot-side temperature dependent maximum temperature difference (ΔT) between this work and the commercial thermoelectric (TE) legs.
Figure 5B:
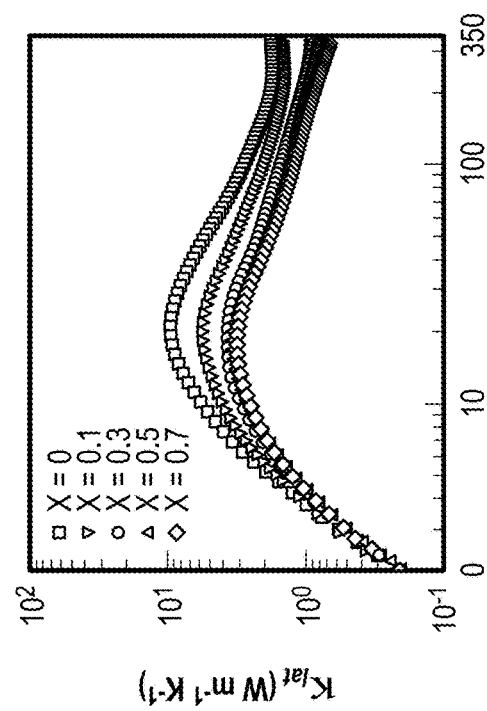
Figure 5C:
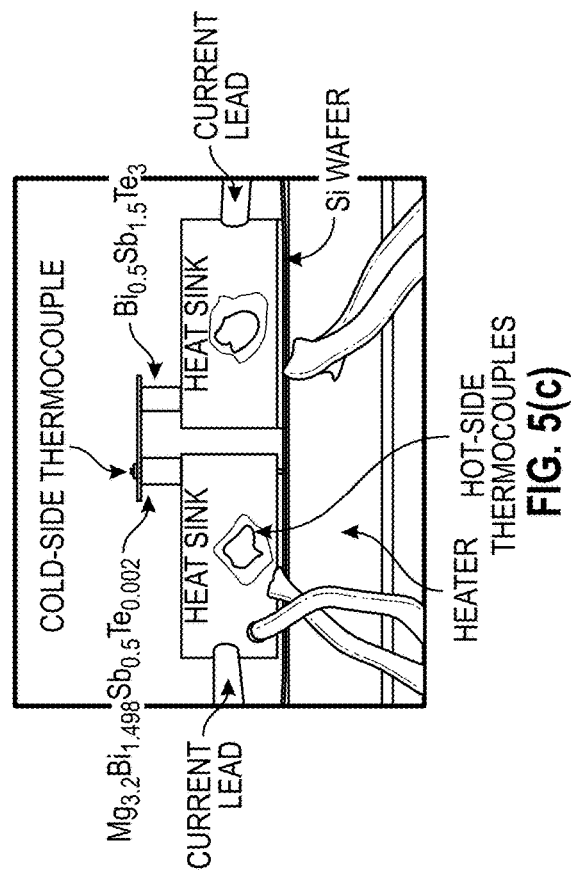

A substantial reduction in the thermal conductivity of $Mg_{3.2}Bi_{1.998-x}Sb_xTe_{0.002}$ was observed with increasing Sb concentration (FIG. 15). Such a reduction should be mainly attributed to the significantly reduced lattice thermal conductivity ($\kappa_{lat}$) as shown in FIG. 5*a*. The peak lattice thermal conductivity is as high as ~9.6 $W\ m^{-1}\ K^{-1}$ for $Mg_{3.2}Bi_{1.998}Te_{0.002}$ and it is only ~3.5 $W\ m^{-1}\ K^{-1}$ for $Mg_{3.2}Bi_{1.298}Sb_{0.7}Te_{0.002}$, a reduction of ~65%. Benefitting from the largely reduced lattice thermal conductivity, substantial enhancements in the thermoelectric figure of merit have been realized (FIG. 5*b*). The ZT at 350 K is around 0.3 for $Mg_{3.2}Bi_{1.998}Te_{0.002}$ and it is more than 0.9 for $Mg_{3.2}Bi_{1.298}Sb_{0.7}Te_{0.002}$. Although the thermoelectric performance of $Mg_{3.2}Bi_{1.998-x}Sb_xTe_{0.002}$ decreases with reduced temperature, both $Mg_{3.2}Bi_{1.498}Sb_{0.5}Te_{0.002}$ and $Mg_{3.2}Bi_{1.298}Sb_{0.7}Te_{0.002}$ maintain a ZT above 0.1 down to 120 K. The average ZT (calculated by the integration method) between 100 K and 350 K is ~0.4 for $Mg_{3.2}Bi_{1.298}Sb_{0.7}Te_{0.002}$, ~0.5 for $Mg_{3.2}Bi_{1.498}Sb_{0.5}Te_{0.002}$, and ~0.2 for $Mg_{3.2}Bi_{1.998}Te_{0.002}$. Therefore, the n-type $Mg_{3.2}Bi_2$-based materials are very promising for application in low-temperature thermoelectric cooling.

Figure 5D:
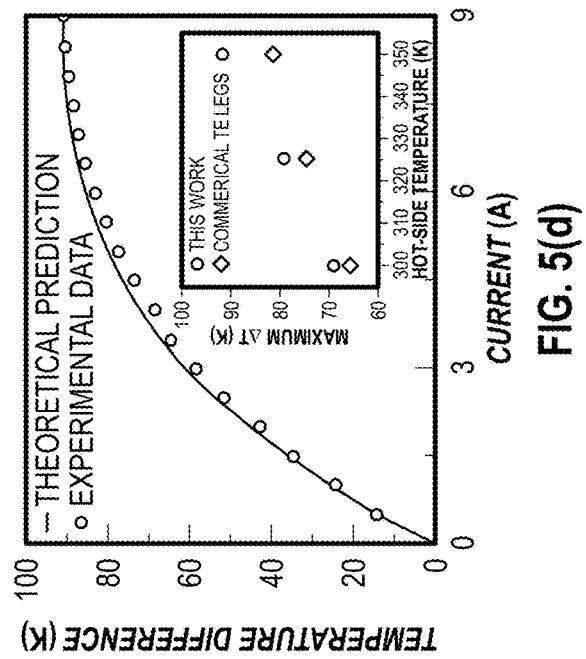
Figure 6A:
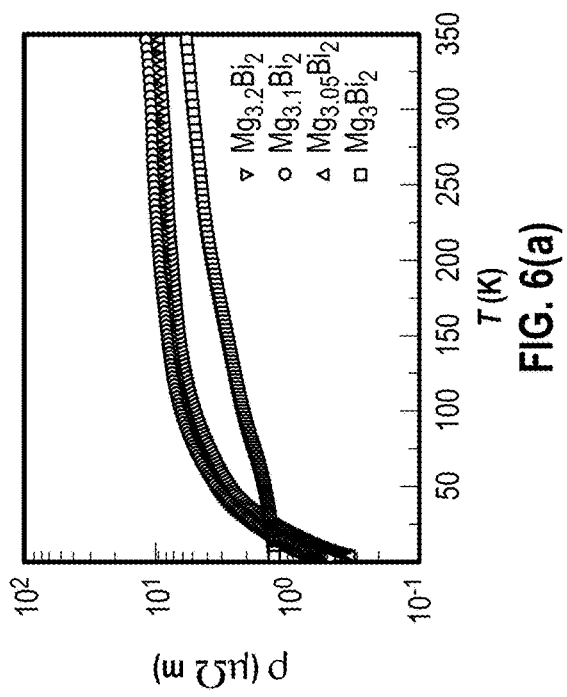
FIG. 6. Depicts the thermoelectric properties of $Mg_4Bi_2$ (δ=0, 0.05, 0.1, and 0.2). (a) Electrical resistivity, (b) Seebeck coefficient, (c) power factor, (d) thermal conductivity, (e) lattice thermal conductivity, and (f) ZT wherein the $Mg_3Bi_2$ shows strong p-type conduction, while $Mg_3Bi_2$ with excess Mg in the nominal composition of $Mg_{3+δ}Bi_2$ (δ=0.5, 0.1, and 0.2) is n-type (FIG. S1b). The Seebeck coefficient of p-type $Mg_3Bi_2$ is only ~50 μV K$^{-1}$ at 350 K but it is as high as ~−100 μV K$^{-1}$ for n-type $Mg_{3+δ}Bi_2$. Such a noticeable difference in Seebeck coefficient can be partially ascribed to the large electron-to-hole weighted mobility ratio. As a result, the power factor of p-type $Mg_3Bi_2$ is much lower compared to that of the n-type $Mg_{3+δ}Bi_2$. In addition, it is very interesting to note that all of the n-type $Mg_{3+δ}Bi_2$ samples show high peak thermal conductivity of more than 20 W m$^{-1}$ K$^{-1}$ around 20 K and it is only ~3.8 W m$^{-1}$ K$^{-1}$ for p-type $Mg_3Bi_2$. Such a difference in thermal conductivity should be ascribed to the strong phonon scattering by Mg vacancies in p-type $Mg_3Bi_2$.
Figure 6B:
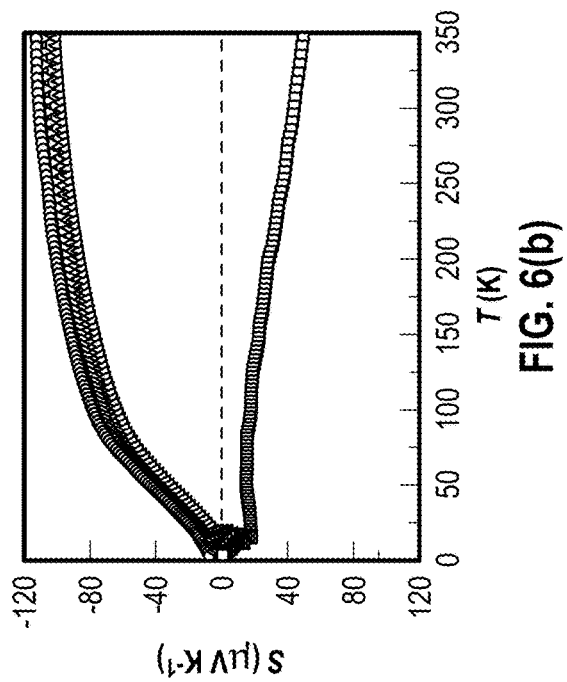
Figure 6C:
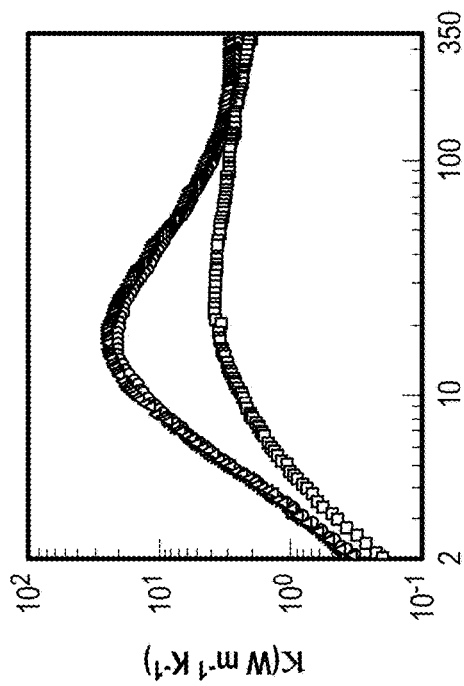
Figure 6D:
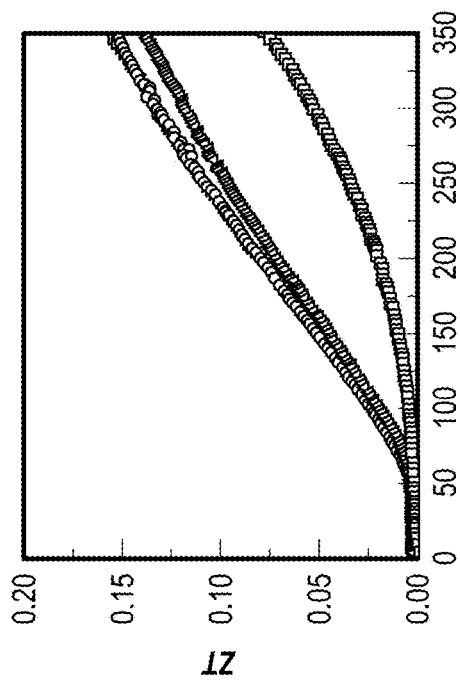
Figure 6E:
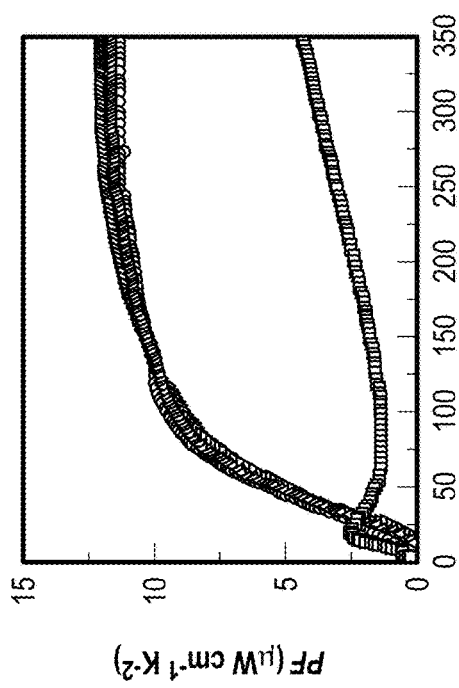
Figure 6F:
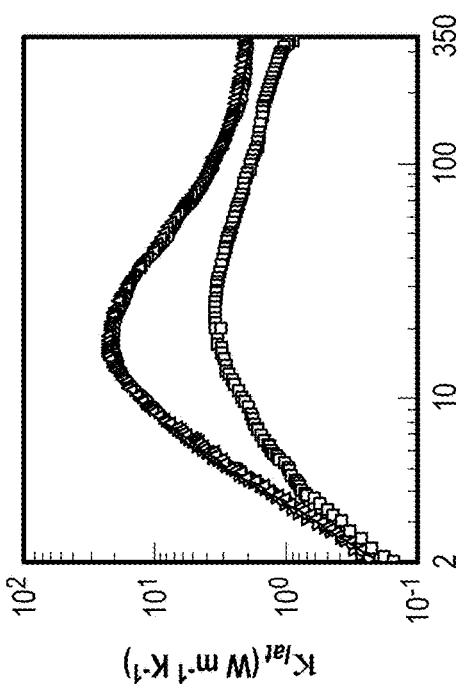
Figure 7A:
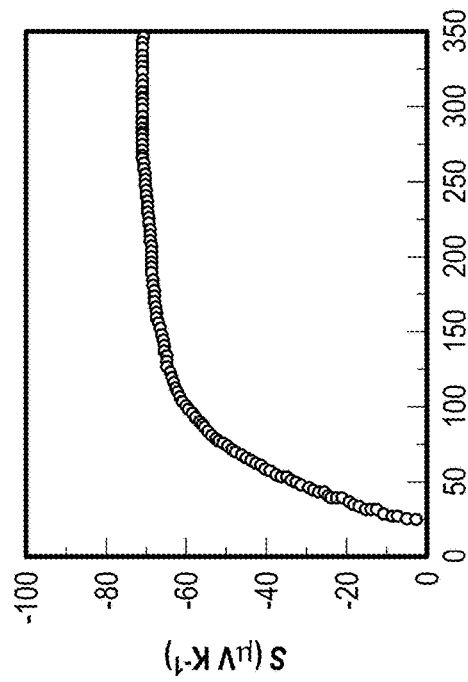
FIG. 7. Depicts the thermoelectric properties of polycrystalline bismuth. (a) Electrical resistivity, (b) Seebeck coefficient, (c) thermal conductivity, and (d) ZT.
Figure 7B:
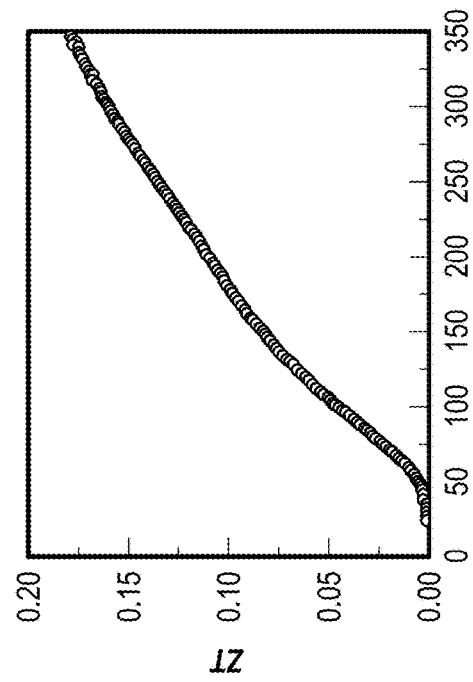
Figure 7C:
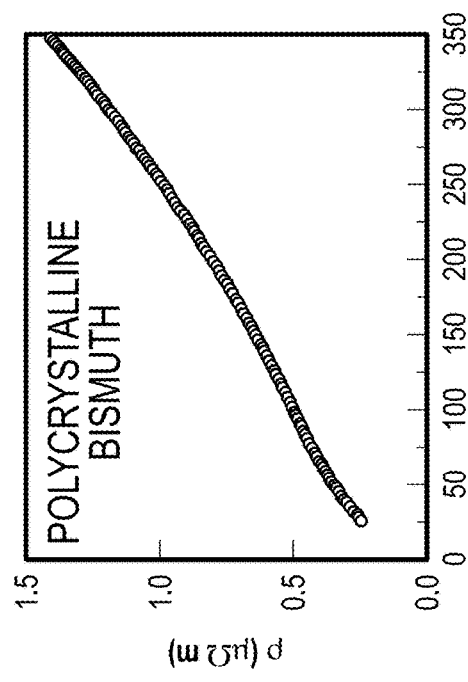
Figure 7D:
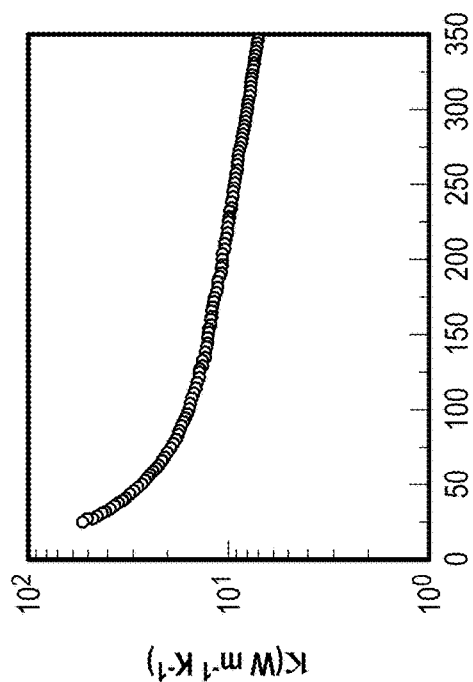
Figure 16D:
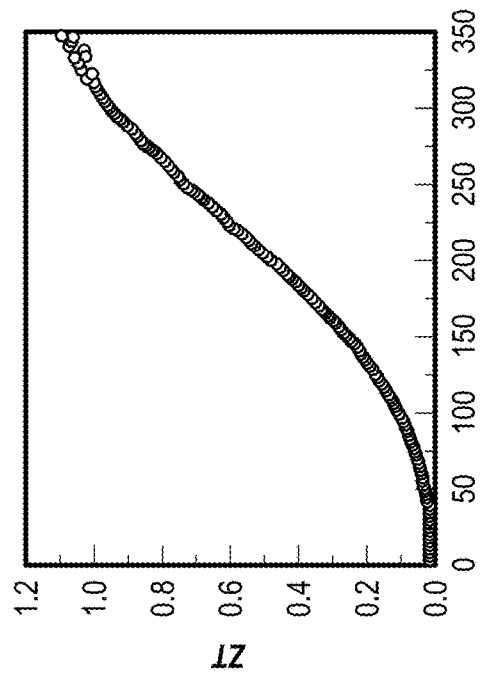
FIG. 16 depicts the thermoelectric properties of $Bi_{0.5}Sb_{1.5}Te_3$. (a) Electrical resistivity, (b) Seebeck coefficient, (c) thermal conductivity, and (d) figure of merit.
Figure 16C:
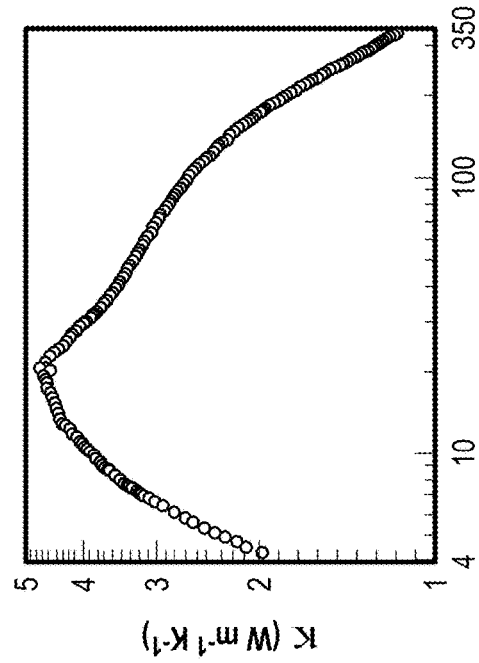
Figure 17:
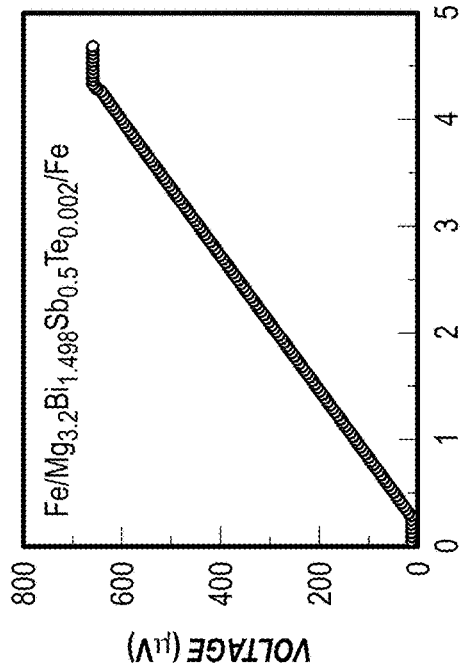
FIG. 17 depicts the contact resistance measurement of $Fe/Mg_{3.2}Bi_{1.498}Sb_{0.5}Te_{0.002}Fe$.

To validate such a potential, a unicouple consisting of n-type $Mg_{3.2}Bi_{1.498}Sb_{0.5}Te_{0.002}$ and p-type $Bi_{0.5}Sb_{1.5}Te_3$ (its low-temperature thermoelectric performance can be found at FIG. 16) was prepared and a cooling measurement was conducted. The experimental setup for the cooling measurement is shown in FIG. 5 (*c*), where the thermoelectric legs have been separately soldered onto two copper blocks and bridged by a copper plate. The copper blocks were placed on a heater to maintain the hot-side temperature around 350 K during the cooling measurement. A silicon wafer was placed in between the copper blocks and heater for electrical insulation. By applying electrical current to the unicouple, heat is removed from the top copper plate (i.e., the cold-side) and dissipates into the bottom copper blocks (i.e., the hot-side) due to the Peltier effect[2]. As a result, a temperature difference will exist between the cold and hot sides. As shown in FIG. 5*d*, the temperature difference between the hot and cold sides first increases with increasing applied electrical current and then saturates at high electrical current. Finally, a large temperature difference of ~91 K can be obtained with the hot-side temperature maintained around 350 K. Comparison of the hot-side temperature dependent maximum temperature difference ($\Delta T$) between this unicouple and the commercial thermoelectric legs is further shown in the inset of FIG. 5*d*. Clearly, the cooling performance of the unicouple consisting of n-type $Mg_{3.2}Bi_{1.498}Sb_{0.5}Te_{0.002}$ and p-type $Bi_{0.5}Sb_{1.5}Te_3$ is better than the commercial thermoelectric legs consisting of n-type $Bi_2Te_{2.7}Se_{0.3}$ and p-type $Bi_{0.5}Sb_{1.5}Te_3$. It should be noted that the dimensions of the n-type $Mg_{3.2}Bi_{1.498}Sb_{0.5}Te_{0.002}$ and p-type $Bi_{0.5}Sb_{1.5}Te_3$ legs are optimized according to their thermoelectric properties at 350 K, therefore the cooling performance of the unicouple at the hot-side temperature of 300 and 325 K is not optimized. It is worth pointing out that the contact to nanostructured n-type $Bi_2Te_{2.7}Se_{0.3}$ is notoriously difficult[49], while Fe is a good contact material for n-type $Mg_{3.2}Bi_2$-based materials (FIG. 17) and it is easy to fabricate the thermoelectric leg of $Fe/Mg_{3.2}Bi_{1.498}Sb_{0.5}Te_{0.002}/Fe$.

Additionally, the $Mg_{3.2}Bi_2$-based materials are much cheaper than $Bi_2Te_{2.7}Se_{0.3}$ due to the higher price of Te. Therefore, replacing $Bi_2Te_{2.7}Se_{0.3}$ with the $Mg_3Bi_2$-based materials can significantly reduce the cost of thermoelectric module. Due to the excellent cooling performance of the n-type $Mg_{3.2}Bi_2$-based materials and their advantages over $Bi_2Te_{2.7}Se_{0.3}$, the n-type $Mg_{3.2}Bi_2$-based materials can potentially change the landscape of cooling applications by using thermoelectric modules. Conclusions: In this work, it has been demonstrated that the weighted mobility ratio, which can be used to quantify the asymmetry of thermoelectric transport properties between the conduction and valence bands, can play a decisive role in bipolar conduction. When the weighted mobility ratio has an extreme value (either A>>1 or A<<1), the effect of bipolar conduction on the Seebeck coefficient can be substantially minimized. Therefore, semi-metals and semiconductors with a very narrow bandgap can possibly achieve a large Seebeck coefficient around ambient temperature when the weighted mobility ratio has an extreme value. Experimentally, it has been demonstrated herein that the semi-metallic $Mg_{3.2}Bi_2$ shows an unexpectedly high Seebeck coefficient of above −100 $\mu V\ K^{-1}$ around 300 K and promising thermoelectric performance. The optimized $Mg_{3.2}Bi_{1.298}Sb_{0.7}Te_{0.002}$ can realize a peak ZT above 0.9 at 350 K and ZT above ~0.1 down to the temperature of 120 K.

These results show that n-type $Mg_{3.2}Bi_2$-based materials are highly promising for thermoelectric cooling applications. A unicouple consisting of n-type $Mg_{3.2}Bi_{1.498}Sb_{0.5}Te_{0.002}$ and p-type $Bi_{0.5}Sb_{1.5}Te_3$ can realize a large temperature difference of ~91 K with the hot-side temperature of ~350 K, which is better than the commercial thermoelectric legs. Importantly, it has been demonstrated herein that semi-metals and semiconductors (with a very narrow bandgap) with extreme weighted mobility ratios could exhibit outstanding thermoelectric performance. This work greatly expands the scope for the future discovery of promising thermoelectric materials.

Experimental Section

Synthesis: High-purity magnesium turnings (Mg, 99.98%; Alfa Aesar), antimony shots (Sb, 99.8%; Alfa Aesar), bismuth pieces (Bi, 99.99%; Alfa Aesar), and tellurium pieces (Te, 99.999%; Alfa Aesar) were weighed according to the composition of $Mg_{3+\delta}Bi_2$ ($\delta$=0, 0.05, 0.1, and 0.2), $Mg_{3.2}Bi_{2-x}Te_x$ (x=0, 0.002, and 0.004), $Mg_{3.2}Bi_{1.998-x}Sb_xTe_{0.002}$ (x=0, 0.1, 0.3, 0.5, and 0.7), and $Mg_{3.2}Bi_{2-x}Sb_x$ (x=0, 0.1, 0.2, 0.3, 0.4, 0.5, 0.6, and 0.7). The elements were loaded into a stainless-steel ball-milling jar in a glove box under an argon atmosphere with an oxygen and water level below 0.1 ppm. The materials were ball milled for 10 hours. The ball-milled powders were then loaded into a graphite die with an inner diameter of 12.7 mm in a glove box. The graphite die with the loaded powders was immediately hot pressed at 1073 K for 2 minutes. The hot-pressed disks are about 2-3 mm thick. The polycrystalline bismuth sample was prepared by ball milling the bismuth pieces (Bi, 99.99%; Alfa Aesar) for one minute and then hot-pressing at 513 K for 5 minutes.

Phase composition: Phase compositions of the samples were characterized by X-ray diffraction (PANalytical X'pert PRO diffractometer). All of the samples prepared in this work are single-phase (FIG. 18).

Thermoelectric property characterizations: Samples were cut into bar-shaped pieces with the dimensions of ~3.5× ~3.5×~7 mm$^3$. Thermoelectric transport properties of each sample were measured from 350 K to 2 K at high vacuum (below 1×10$^{-5}$ Torr) via the thermal transport option in a physical properties measurement system (PPMS) by Quantum Design. The four-probe lead configuration method was used to avoid the influence of lead contact resistance. The gold-plated copper leads were attached to the sample by using the silver-filled H20E epoxy. To ensure good mechanical bonding, samples with attached leads were heated on the hot-plate at 400 K for 10 minutes. The Hall coefficient RH was obtained from the magnetic field-dependent Hall resistivities via the electrical transport option in PPMS. The carrier concentration $n_H$ was calculated by $n_H=1/eR_H$.

Thermoelectric cooling measurement: To characterize the thermoelectric cooling performance, a unicouple consisting of n-type $Mg_{3.2}Bi_{1.498}Sb_{0.5}Te_{0.002}$ and p-type $Bi_{0.5}Sb_{1.5}Te_3$ was prepared. To ensure low electrical contact resistance, it is necessary to electroplate Ni on both sides of $Bi_{0.5}Sb_{1.5}Te_3$. In addition, Fe contact layers are necessary for $Mg_{3.2}Bi_{1.498}Sb_{0.5}Te_{0.002}$ to realize a low contact resistance (FIG. 17)[50]. The $Mg_{3.2}Bi_{1.498}Sb_{0.5}Te_{0.002}$ powders were sandwiched between Fe powders and then hot pressed at 1073 K for 2 minutes. To realize the maximum cooling performance, the dimensions of thermoelectric legs needs to be considered according to the relation of $$\left(\frac{A_1/l_1}{A_2/l_2}\right)_{opt} = \sqrt{\frac{\sigma_2 \kappa_2}{\sigma_1 \kappa_1}}$$

(based on the thermoelectric properties at 350 K), where A is the cross-section area and l is the leg length. The $Mg_{3.2}Bi_{1.498}Sb_{0.5}Te_{0.002}$ is ~4.01 mm thick and the two Fe contact layers together are ~0.82 mm thick, so the total length of the $Mg_{3.2}Bi_{1.498}Sb_{0.5}Te_{0.002}$ leg is ~4.83 mm. The $Bi_{0.5}Sb_{1.5}Te_3$ leg is also ~4.83 mm. The cross-section area is ~3.52×~3.76 mm$^2$ for $Mg_{3.2}Bi_{1.498}Sb_{0.5}Te_{0.002}$ and ~3.45× ~2.99 mm$^2$ for $Bi_{0.5}Sb_{1.5}Te_3$. The thermoelectric legs were soldered to the copper blocks and the copper plate by using $Pb_{37}Sn_{63}$ foils (with a melting point of ~430 K). In fact, Ni was also electroplated on the copper blocks and copper plate to minimize the surface oxidation during the soldering process. The cooling measurement was performed at vacuum (below 10$^{-4}$ Torr).

Theoretical calculation: All of the first-principles calculations were performed by using the Quantum ESPRESSO package[51]. A fully relativistic projector-augmented-wave (PAW) pseudopotential with Perdew-Burke-Emzerhof (PBE) for exchange-correlation energy functional was employed to calculate the electronic Hamiltonian. Monkhorst-Pack k-point meshes with 8×8×6 and 80×80×60 configurations were employed in the self-consistent and Fermi-surface calculations respectively. The finite difference method was employed to calculate the effective mass tensor, of which the eigenvalues were evaluated.

In conclusion, in some embodiments herein, the optimized $Mg_{3.2}Bi_2$-based thermoelectric materials demonstrate a high ZT of ~0.9 at 350 K. Such a high performance is better than the state-of-the-art n-type $Bi_2Te_{2.7}Se_{0.3}$. However, minimization of the contact resistance remains to be a challenge for the nanostructured $Bi_2Te_{2.7}Se_{0.3}$. In comparison, it has been found herein that Fe is a good contact material for n-type $Mg_{3.2}Bi_2$-based materials and it is very easy to fabricate the $Fe/Mg_{3.2}Bi_{1.498}Sb_{0.5}Te_{0.002}/Fe$ thermoelectric legs (Many other elements can also be used as contact materials such as Ni, or Cu).

Additionally, the $Mg_{3.2}Bi_2$-based materials are much cheaper than $Bi_2Te_{2.7}Se_{0.3}$ due to the higher price of Te. Therefore, replacing $Bi_2Te_{2.7}Se_{0.3}$ with the $Mg_{3.2}Bi_2$-based materials can significantly reduce the cost of thermoelectric module. Due to the excellent cooling performance of the n-type $Mg_{3.2}Bi_2$-based materials and their advantages over $Bi_2Te_{2.7}Se_{0.3}$, the n-type $Mg_{3.2}Bi_2$-based materials paired with the existing p-type $Bi_2Te_3$-based materials can potentially change the landscape of cooling applications by using thermoelectric modules.

Herein the following references are incorporated in their entirety:

[1] A. F. Ioffe, *Semiconductor thermoelements and thermoelectric cooling*, Infosearch, London 1957; [2] H. Goldsmid, *Thermoelectric refrigeration*, Springer US, New York 1964; [3] F. J. DiSalvo, *Science* 1999, 285, 703; [4] L. E. Bell, *Science* 2008, 321, 1457; [5] Y. Z. Pei, H. Wang, G. J. Snyder, *Adv. Mater.* 2012, 24, 6125. [6] G. J. Tan, L. D. Zhao, M. G. Kanatzidis, *Chem. Rev.* 2016, 116, 12123. [7] X. Shi, L. D. Chen, C. Uher, *Int. Mater. Rev.* 2016, 61, 379. [8] J. He, T. M. Tritt, *Science* 2017, 357, eaak9997. [9] T. J. Zhu, Y. T. Liu, C. G. Fu, J. P. Heremans, J. G. Snyder, X. B. Zhao, *Adv. Mater.* 2017, 29, 1605884. [10] Y. Zhou, L. D. Zhao, *Adv. Mater.* 2017, 29, 1702676. [11] J. Mao, Z. Liu, J. Zhou, H. Zhu, Q. Zhang, G. Chen, Z. Ren, *Adv. Phys.* 2018, 67, 69. [12] H. J. Goldsmid, *Introduction to thermoelectricity*, Vol. 121, Springer Science & Business Media, 2009. [13] R. Chasmar, R. Stratton, *Int. J. Electron.* 1959, 7, 52. [14] G. D. Mahan, *J. Appl. Phys.* 1989, 65, 1578. [15] J. O. Sofo, G. D. Mahan, *Phys. Rev. B* 1994, 49, 4565. [16] H. J. Goldsmid, J. W Sharp, *J. Electron. Mater.* 1999, 28, 869. [17] J. Schmitt, Z. M. Gibbs, G. J. Snyder, C. Felser, *Mater. Horiz.* 2015, 2, 68. [18] Z. M. Gibbs, H.-S. Kim, H. Wang, G. J. Snyder, *Appl. Phys. Lett.* 2015, 106, 022112. [19] J. H. Bahk, A. Shakouri, *Appl. Phys. Lett.* 2014, 105, 052106. [20] S. Wang, J. Yang, T. Toll, J. Yang, W. Zhang, X. Tang, *Sci. Rep.* 2015, 5, 10136. [21] J. H. Bahk, A. Shakouri, *Phys. Rev. B* 2016, 93, 165209. [22] H. Tamaki, H. K. Sato, T. Kanno, *Adv. Mater.* 2016, 28, 10182. [23] J. Zhang, L. Song, S. H. Pedersen, H. Yin, L. T. Hung, B. B. Iversen, *Nat. Commun.* 2017, 8, 13901. [24] J. Mao, J. Shuai, S. W. Song, Y. X. Wu, J. W. Zhou, Z. H. Liu, J. F. Sun, Y. Z. Pei, Q. Y. Zhang, D. J. Singh, G. Chen, Z. F. Ren, *Proc. Natl. Acad. Sci. U.S.A.* 2017, 114, 10548. [25] J. W. Zhang, L. R. Song, A. Mamakhel, M. R. V. Jorgensen, B. B. Iversen, *Chem. Mater.* 2017, 29, 5371. [26] J. Mao, Y. Wu, S. Song, Q. Zhu, J. Shuai, Z. Liu, Y. Pei, Z. F. Ren, *ACS Energy Lett.* 2017, 2, 2245. [27] J. Shuai, J. Mao, S. W. Song, Q. Zhu, J. F. Sun, Y. M. Wang, R. He, J. W. Zhou, G. Chen, D. J. Singh, Z. F. Ren, *Energy Environ. Sci.* 2017, 10, 799. [28] J. Mao, Y. X. Wu, S. W. Song, J. Shuai, Z. H. Liu, Y. Z. Pei, Z. F. Ren, *Mater. Today Phys.* 2017, 3, 1. [29] J. Zhang, L. Song, M. Sist, K. Tolborg, B. B. Iversen, *Nat. Commun.* 2018, 9, 4716. [30] T. Kanno, H. Tamaki, H. K. Sato, S. D. Kang, S. Ohno, K. Imasato, J. J. Kuo, G. J. Snyder, Y. Miyazaki, *Appl. Phys. Lett.* 2018, 112, 033903. [31] S. Ohno, K. Imasato, S. Anand, H. Tamaki, S. D. Kang, P. Gorai, H. K. Sato, E. S. Toberer, T. Kanno, G. J. Snyder, *Joule* 2018, 2, 141. [32]K. Imasato, M. Wood, J. J. Kuo, G. J. Snyder, *J. Mater. Chem. A* 2018. [33] J. J. Kuo, S. D. Kang, K. Imasato, H. Tamaki, S. Ohno, T. Kanno, G. J. Snyder, *Energy Environ. Sci.* 2018, 11, 429. [34] X. Chen, H. Wu, J. Cui, Y. Xiao, Y. Zhang, J. He, Y. Chen, J. Cao, W. Cai, S. J. Pennycook, Z. Liu, L.-D. Zhao, J. Sui, *Nano Energy* 2018, 52, 246. [35] R. Shu, Y. Zhou, Q. Wang, Z. Han, Y. Zhu, Y. Liu, Y. Chen, M. Gu, W. Xu, Y. Wang, W. Zhang, L. Huang, W. Liu, *Adv. Funct. Mater.* 2019, 29, 1807235. [36] K. Imasato, S. D. Kang, G. J. Snyder, *Energy Environ. Sci.* 2019. [37]V. Ponnambalam, D. T. Morelli, *J. Electron. Mater.* 2013, 42, 1307. [38] J. Xin, G. Li, G. Auffermann, H. Borrmann, W. Schnelle, J. Gooth, X. Zhao, T. Zhu, C. Felser, C. Fu, *Mater. Today Phys.* 2018, 7, 61. [39] T. R. Chang, I. Pletikosic, T. Kong, G. Bian, A. Huang, J. Denlinger, S. K. Kushwaha, B. Sinkovic, H. T. Jeng, T. Valla, W. Xie, R. J. Cava, *Adv. Sci.* 2019, 6, 1800897. [40] R. W. Boydston, *Phys. Rev.* 1927, 30, 911. [41]B. Chandrasekhar, *J. Phys. Chem. Solids* 1959, 11, 268. [42] C. F. Gallo, B. S. Chandrasekhar, P. H. Sutter, *J. Appl. Phys.* 1963, 34, 144. [43]H. Goldsmid, Phys. Status Solidi A 1970, 1, 7. [44] H. J. Goldsmid, "Bismuth: the thermoelectric material of the future?", presented at *25th International Conference on Thermoelectrics*, 2006. [45] X. Zhang, L. Jin, X. Dai, G. Liu, *J. Phys. Chem. Lett.* 2017, 8, 4814. [46] Y. Z. Pei, A. D. LaLonde, H. Wang, G. J. Snyder, *Energy Environ. Sci.* 2012, 5, 7963. [47] B. Abeles, S. Meiboom, *Phys. Rev* 1956, 101, 544. [48]A. L. Jain, *Phys. Rev.* 1959, 114, 1518. [49] W. Liu, H. Wang, L. Wang, X. Wang, G. Joshi, G. Chen, Z. Ren, *J. Mater. Chem. A* 2013, 1, 13093. [50] Q. Zhu, S. Song, H. Zhu, Z. Ren, *J. Power Sources* 2019, 414, 393. [51] P. Giannozzi, S. Baroni, N. Bonini, M. Calandra, R. Car, C. Cavazzoni, D. Ceresoli, G. L. Chiarotti, M. Cococcioni, I. Dabo, *J. Phys. Conden. Matter* 2009, 21, 395502.U.S. Pat. Nos. 7,465,871; 9,011,763; 8,293,168.

What is claimed is:

1. A thermoelectric material, comprising:
   a n-type Mg3.2Bi(2-x-y)SbxTey Zintl phase compound, wherein x=from 0.1 to 0.7 and y=0.002, or 0.004, and wherein the Mg3.2Bi(2-x-y)SbxTey Zintl phase compound exhibits a ZT of about 0.9 at about 350 K and a Seebeck coefficient that is negative and has an absolute value of at least 100 µV K$^{-1}$ at about 350 K.

2. The thermoelectric material of claim 1, wherein said compound comprises an electron-to-hole weighted mobility ratio greater than 8.

3. The thermoelectric material of claim 1, wherein the $Mg_{3.2}Bi_{(2-x-y)}Sb_xTe_y$ compound is $Mg_{3.2}Bi_{1.498}Sb_{0.5}Te_{0.002}$.

4. The thermoelectric material of claim 1, wherein the thermoelectric material is a component of a thermoelectric pair further comprising a p-type compound comprising $Bi_{0.5}Sb_{1.5}Te_3$ for the purpose of demonstrating the delta T.

5. The thermoelectric material of claim 4, wherein the thermoelectric pair exhibits a temperature difference of about 91 K with a hot-side temperature maintained at about 350 K.

6. The thermoelectric material of claim 5, wherein the thermoelectric material is a component of a device, wherein said device comprises thermoelectric legs, and wherein said thermoelectric legs comprise an enhanced cooling performance.

7. The thermoelectric material of claim 6, wherein the device comprises a contact material.

8. The thermoelectric material of claim 7, wherein said contact material is at least one of Fe, Ni, Cu, or a combination of some of them, or another semimetal.

9. The thermoelectric material of claim 8, wherein said contact material is Fe.

10. The thermoelectric material of claim 6, wherein said thermoelectric legs comprise $Fe/Mg_{3.2}Bi_{1.498}Sb_{0.5}Te_{0.002}$/Fe.

11. The thermoelectric material of claim 1, wherein a power factor of the thermoelectric material is at least 20 µW cm$^{-1}$ K$^{-2}$ over a temperature range of about 200 K to 350 K.

12. The thermoelectric material of claim 1, wherein an electrical resistivity of the thermoelectric material is from more than 0.58 µΩ*m to less than 9 µΩ*m from about 2 K to about 300 K.

13. The thermoelectric material of claim 1, wherein a thermal conductivity of the thermoelectric material is not more than about 2.8 W m$^{-1}$ K$^{-1}$ at about 300 K.

14. The thermoelectric material of claim 3, wherein the $Mg_{3.2}Bi_{(2-x-y)}Sb_xTe_y$ Zintl phase compound comprises a Seebeck coefficient that is negative and has an absolute value of at least 107 µV K$^{-1}$ at about 350 K.

* * * * *